(12) United States Patent
Ikeuchi et al.

(10) Patent No.: US 11,018,292 B2
(45) Date of Patent: May 25, 2021

(54) PIEZOELECTRIC DEVICE, PIEZOELECTRIC TRANSFORMER, AND METHOD OF MANUFACTURING PIEZOELECTRIC DEVICE

(71) Applicant: Murata Manufacturing Co., Ltd., Nagaokakyo (JP)

(72) Inventors: Shinsuke Ikeuchi, Nagaokakyo (JP); Kansho Yamamoto, Nagaokakyo (JP); Takuo Hada, Nagaokakyo (JP); Yoichi Mochida, Nagaokakyo (JP); Hideya Horiuchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 774 days.

(21) Appl. No.: 15/795,579

(22) Filed: Oct. 27, 2017

(65) Prior Publication Data
US 2018/0069168 A1    Mar. 8, 2018

Related U.S. Application Data

(63) Continuation of application No. PCT/JP2016/061547, filed on Apr. 8, 2016.

(30) Foreign Application Priority Data

Apr. 30, 2015   (JP) .............................. JP2015-093091

(51) Int. Cl.
*H01L 41/09*   (2006.01)
*H01L 41/107*   (2006.01)
(Continued)

(52) U.S. Cl.
CPC ............ *H01L 41/09* (2013.01); *H01L 41/044* (2013.01); *H01L 41/0471* (2013.01);
(Continued)

(58) Field of Classification Search
CPC ... H01L 41/09; H01L 41/0471; H01L 41/083; H01L 41/187; H01L 41/107; H01L 41/31;
(Continued)

(56) References Cited

U.S. PATENT DOCUMENTS

| 7,504,765 B2 | 3/2009 | Ohki et al. |
| 2005/0046312 A1* | 3/2005 | Miyoshi .............. H01L 41/0471 310/366 |

(Continued)

FOREIGN PATENT DOCUMENTS

| JP | H06-105395 A | 4/1994 |
| JP | 2001-152360 A | 6/2001 |

(Continued)

OTHER PUBLICATIONS

English Translation of JP 2014195495 (Year: 2014).*

(Continued)

*Primary Examiner* — Bryan P Gordon
(74) *Attorney, Agent, or Firm* — Arent Fox LLP

(57) ABSTRACT

A piezoelectric device that includes a base member having an opening therein and an upper layer supported by the base member. The upper layer includes a vibration portion at a location corresponding to the opening in the base member. The vibration portion includes a lower electrode, an intermediate electrode and an upper electrode that are spaced apart from one another in a thickness direction of the piezoelectric device. The upper layer includes a first piezoelectric layer disposed so as to be at least partially sandwiched between the lower electrode and the intermediate electrode, and a second piezoelectric layer disposed so as to overlap with the first piezoelectric layer and so as to be at least partially sandwiched between the intermediate electrode and the upper electrode. The first piezoelectric layer and the second piezoelectric layer are different in relative (Continued)

permittivity in the thickness direction of the piezoelectric device.

15 Claims, 37 Drawing Sheets

(51) Int. Cl.
| | | |
|---|---|---|
| H01L 41/047 | (2006.01) | |
| H01L 41/04 | (2006.01) | |
| H01L 41/31 | (2013.01) | |
| H01L 41/083 | (2006.01) | |
| H01L 41/187 | (2006.01) | |
| H01L 41/314 | (2013.01) | |
| H04R 17/00 | (2006.01) | |

(52) U.S. Cl.
CPC .......... *H01L 41/083* (2013.01); *H01L 41/107* (2013.01); *H01L 41/187* (2013.01); *H01L 41/31* (2013.01); *H01L 41/314* (2013.01); *H04R 17/00* (2013.01); *H04R 2201/003* (2013.01)

(58) Field of Classification Search
CPC .. H01L 41/044; H04R 2201/003; H04R 17/00
See application file for complete search history.

(56) References Cited

U.S. PATENT DOCUMENTS

| | | |
|---|---|---|
| 2006/0202769 A1 | 9/2006 | Nagao et al. |
| 2007/0138919 A1 | 6/2007 | Ohki |
| 2012/0176002 A1 | 7/2012 | Kim et al. |
| 2013/0229465 A1* | 9/2013 | Fuju ............... H01L 41/0533 347/72 |
| 2015/0163598 A1* | 6/2015 | Abe ............... H01L 41/053 381/114 |

FOREIGN PATENT DOCUMENTS

| | | |
|---|---|---|
| JP | 2007-043233 A | 2/2007 |
| JP | 2007-173297 A | 7/2007 |
| JP | 2009-020086 A | 1/2009 |
| JP | 2012-147418 A | 8/2012 |
| JP | 2015-001420 A | 1/2015 |
| WO | WO 2004/088840 A1 | 10/2004 |
| WO | WO 2014/099611 A1 | 6/2014 |
| WO | 2014-195495 A | 10/2014 |

OTHER PUBLICATIONS

International Search Report issued in International Patent Application No. PCT/JP2016/061547, dated Jul. 5, 2016.
Written Opinion of the International Searching Authority issued in International Patent Application No. PCT/JP2016/061547, dated Jul. 5, 2016.

* cited by examiner

PIEZOELECTRIC DEVICE, PIEZOELECTRIC TRANSFORMER, AND METHOD OF MANUFACTURING PIEZOELECTRIC DEVICE

CROSS REFERENCE TO RELATED APPLICATIONS

The present application is a continuation of international application No. PCT/JP2016/061547, filed Apr. 8, 2016, which claims priority to Japanese Patent Application No. 2015-093091, filed Apr. 30, 2015, the entire contents of each of which are incorporated herein by reference.

FIELD OF THE INVENTION

The present invention relates to a piezoelectric device, a piezoelectric transformer, and a method of manufacturing the piezoelectric device.

BACKGROUND OF THE INVENTION

Japanese Patent Laying-Open No. 2014-195495 (PTD 1) discloses an example of a so-called ultrasound transducer device. The device disclosed in PTD 1 includes a base body that includes a substrate and a flexible film (paragraph 0028 in PTD 1). The substrate has a surface on which a flexible film is formed. The substrate is provided with an opening for each element. A part of the flexible film forms a vibration film so as to correspond to the outline of each opening (paragraph 0029 in PTD 1). The vibration film has a surface on which a lower electrode, a first piezoelectric film, an intermediate electrode, a second piezoelectric film, an upper electrode are stacked sequentially in this order (paragraph 0030 in PTD 1).

PTD 1: Japanese Patent Laying-Open No. 2014-195495

SUMMARY OF THE INVENTION

In the device disclosed in PTD 1, when ultrasound is transmitted, that is, when the vibration film is driven, the beam obtained by stacking a non-piezoelectric member and a piezoelectric member, that is, an approximate unimorph beam, can be regarded as undergoing bending vibrations. Thus, the entire beam undergoes bending vibrations.

When the vibration film is driven in the device disclosed in PTD 1, a voltage is applied between a lower electrode and an intermediate electrode (paragraph 0038). Thus, the first piezoelectric film between these electrodes expands and contracts by voltage application. However, a voltage is not applied to the second piezoelectric film, which does not therefore expand and contract. In other words, although the second piezoelectric film is a piezoelectric member, it behaves in the same manner as a non-piezoelectric member. There is the first piezoelectric film as an expanding and contracting member, whereas there are a flexible film, each electrode and the second piezoelectric film as members that do not expand and contract. Accordingly, the proportion of the members that do not expand and contract is relatively high in the vibration film. Also, the vibration film is entirely too thick, with the result that the vibration film is less likely to undergo a bending motion.

The first piezoelectric film as an expanding and contracting member is sandwiched between the flexible film and the second piezoelectric film, both of which does not expand and contract. In an example in which the first piezoelectric film expands, the first piezoelectric film expands while the flexible film does not expand, so that the vibration film tends to deform so as to protrude upward. However, even if the first piezoelectric film expands, the second piezoelectric film does not expand. Accordingly, the vibration film tends to deform so as to protrude downward. In the structure of the device disclosed in PTD 1, such counteracting deformations tend to simultaneously occur, so that deforming forces cancel out each other. Consequently, the bending motion of the vibration film is inhibited.

When the bending motion is reduced by such inhibition, sound pressure becomes insufficient for use as an ultrasound transducer device. Also, the efficiency decreases for use as a piezoelectric transformer.

Thus, an object of the present invention is to provide a highly efficient and reliable piezoelectric device, a piezoelectric transformer, and a method of manufacturing the piezoelectric device.

In order to achieve the above-described object, a piezoelectric device according to the present invention includes: a base member having an opening therein; and an upper layer supported by the base member. The upper layer includes a vibration portion at a location corresponding to the opening in the base member. The vibration portion includes a lower electrode, an intermediate electrode and an upper electrode that are spaced apart from each other in a thickness direction. The upper layer includes a first piezoelectric layer and a second piezoelectric layer. The first piezoelectric layer is disposed so as to be at least partially sandwiched between the lower electrode and the intermediate electrode. The second piezoelectric layer is disposed so as to overlap with the first piezoelectric layer and so as to be at least partially sandwiched between the intermediate electrode and the upper electrode. The first piezoelectric layer and the second piezoelectric layer extend to the vibration portion in the upper layer and extend to reach a portion in which the upper layer overlaps with the base member. The first piezoelectric layer and the second piezoelectric layer are different in relative permittivity in the thickness direction.

According to the present invention, a highly efficient and reliable piezoelectric device can be provided.

DETAILED DESCRIPTION OF PREFERRED EMBODIMENTS

In the following description of the embodiments, mentioning of "upper" or "lower" does not indicate the concept of an absolute upper or lower position, but indicates a relatively upper or lower position in the posture shown in each figure for the sake of explanation. The device described in each of the embodiments is not necessarily implemented in the posture as shown in each figure, but may be implemented in a different direction.

In each figure mentioned in each of the following embodiments, the dimensions may be shown in an exaggerated manner for the sake of explanation. Accordingly, the dimension ratio shown in each of the figures does not always faithfully show the actual dimension ratio.

First Embodiment

Figure 1:
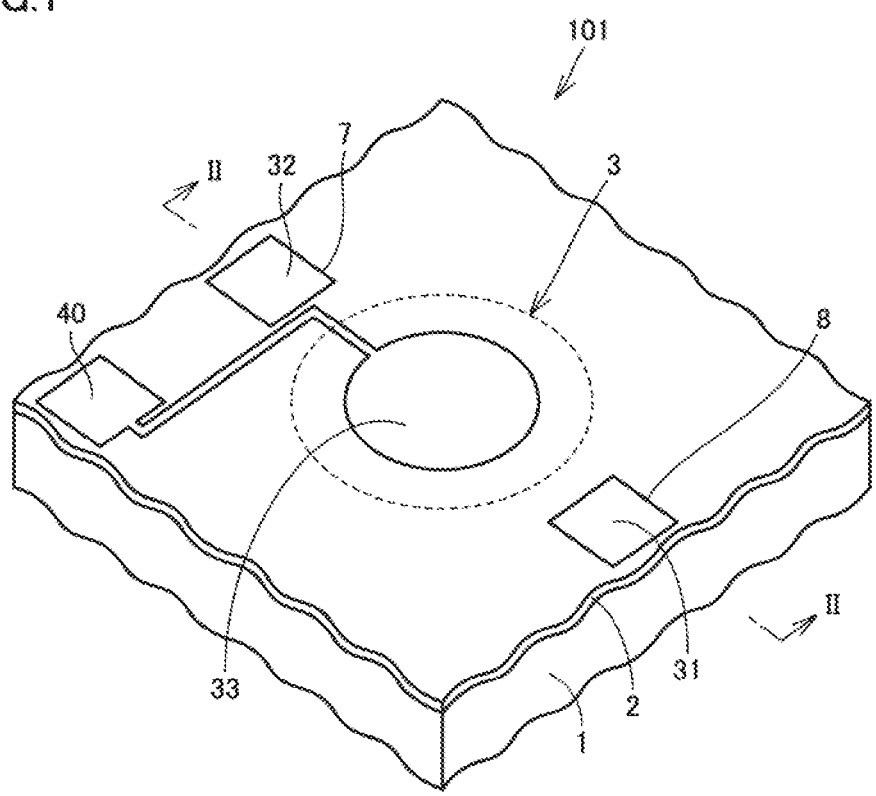
FIG. 1 is a perspective view of a piezoelectric device in the first embodiment according to the present invention.
Figure 2:
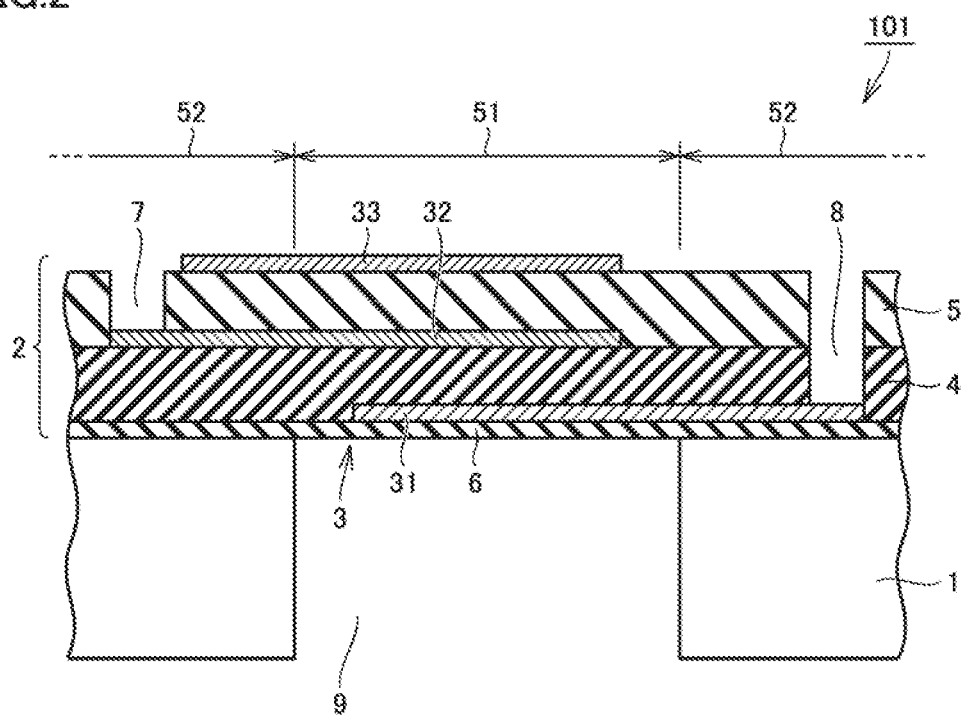
FIG. 2 is a cross-sectional view taken along an arrow line II-II in FIG. 1.

Referring to FIG. 2, a piezoelectric device in the first embodiment according to the present invention will be hereinafter described. FIG. 1 shows a perspective view of a piezoelectric device 101 in the present embodiment. FIG. 2 shows a cross-sectional view taken along an arrow line in FIG. 1. In FIG. 2, the dimensions in the thickness direction are shown in an exaggerated manner for the sake of explanation.

The piezoelectric device in the present embodiment includes a base member 1 and an upper layer 2 supported by base member 1. Upper layer 2 includes a vibration portion 3 corresponding to a portion 51 not overlapping with base member 1 in upper layer 2. Upper layer 2 includes a lower electrode 31, an intermediate electrode 32 and an upper electrode 33 that are spaced apart from one another in the thickness direction. Upper layer 2 includes a first piezoelectric layer 4 and a second piezoelectric layer 5. First piezoelectric layer 4 is disposed so as to be at least partially sandwiched between lower electrode 31 and intermediate electrode 32. Second piezoelectric layer 5 is disposed so as to overlap with first piezoelectric layer 4 and so as to be at least partially sandwiched between intermediate electrode 32 and upper electrode 33. First piezoelectric layer 4 and second piezoelectric layer 5 extend to vibration portion 3 in upper layer 2 and also extend to reach a portion 52 in which upper layer 2 overlaps with base member 1. First piezoelectric layer 4 and second piezoelectric layer 5 are different in relative permittivity in the thickness direction. The "relative permittivity: in the thickness direction" will be described later in detail. As shown in FIG. 2, upper layer 2 may include a protection film 6 that covers the lower surface of lower electrode 31.

Base member 1 is provided with an opening 9. Upper layer 2 includes a portion 51 that does not overlap with base member 1, and a portion 52 that overlaps with base member 1. Upper layer 2 has through holes 7 and 8. Upper electrode 33 is disposed on the upper surface of upper layer 2. Through hole 7 penetrates through second piezoelectric layer 5 intermediate electrode 32 is exposed at the lower end of through hole 7. Through hole 8 penetrates through first piezoelectric layer 4 and second piezoelectric layer 5. Lower electrode 31 is exposed at the lower end of through hole 8. Each of through holes 7 and 8 has a dimension that is actually extremely smaller in the depth direction than in the plane direction. Thus, FIG. 1 does not show a level difference caused by existence of through holes 7 and 8. Also, each of through holes 7 and 8 has an extremely shallow depth. Thus, FIG. 1 shows intermediate electrode 32 and lower electrode 31 as if intermediate electrode 32 and lower electrode 31 are exposed at the same level as the upper surface of upper layer 2. Pad electrode, 40 is disposed on the upper surface of a portion other than vibration portion 3 in upper layer 2. Pad electrode 40 is electrically connected to upper electrode 33 through an interconnection disposed on the upper surface of upper layer 2.

In the present embodiment, two piezoelectric layers are provided, and electrodes are formed such that each of these piezoelectric layers are sandwiched between the electrodes in the thickness direction. In the vibration portion, each of these two piezoelectric layers can be driven in a bending mode. The vibrating plate having the above-described structure is generally called a bimorph vibrating plate.

A voltage is applied between lower electrode 31 and intermediate electrode 32, so that first piezoelectric layer 4 can be driven. A voltage is applied between intermediate electrode 32 and upper electrode 33, so that second piezoelectric layer 5 can be driven. Both piezoelectric layers can also be simultaneously driven.

In the present embodiment, protection film 6 is provided so as to cover the lower surface of lower electrode 31. Thus, the probability of damage to lower electrode 31 can be decreased, so that the piezoelectric device can be improved in reliability.

In the present embodiment, as shown in FIG. 2, first piezoelectric layer 4 and second piezoelectric layer 5 extend to vibration portion 3 in upper layer 2 and also extend to reach portion 52 in which upper layer 2 overlaps with base member 1. Accordingly, the posture of vibration portion 3 can be maintained with the help of the strength of first piezoelectric layer 4 and second piezoelectric layer 5. Opening 9 is located below portion 51. Only portion 52 is directly supported by base member 1, but portion 51 is not supported from below. However, first piezoelectric layer 4 and second piezoelectric layer 5 extend to reach portion 52, so that portion 51 is prevented from extremely hanging down due to its self-weight. Therefore, an efficient and reliable piezoelectric device can be provided.

In addition, it is preferable that first piezoelectric layer 4 is mainly made of a piezoelectric material selected from the group consisting of an AlN-based material, a ZnO-based material and a GaN-based material. It is preferable that second piezoelectric layer 5 is mainly made of a piezoelectric material selected from the group consisting of a PZT-based material, a KNN-based material, a BT-based material, and a Bi alkali titanium-based material, in this case, the PZT-based material is a Pb(Zr, Ti)O$_3$-based material. The KNN-based material is (K, Na)NbO$_3$ and the like. The BT-based material is BaTiO$_3$ and the like. The Bi alkali titanium-based material is (Bi, Na)TiO$_3$—BaTiO$_3$ and the like.

In this case, first piezoelectric layer 4 is excellent in sensing performance and second piezoelectric layer 5 is excellent in driving performance, so that an efficient vibration body can be provided.

(Simulation about Thickness of Piezoelectric Layer)

As an example of the present embodiment, two layers of a PZT layer and an AlN layer as main materials were stacked to form a vibration film having an outer diameter of 500 μm, which was then calculated using the finite element method. The AlN layer corresponds to first piezoelectric layer 4, and the PZT layer corresponds to second piezoelectric layer 5. The stack of the PZT layer and the AlN layer was prepared by slightly changing the thickness of the PZT layer and the thickness of the AlN layer in the state where the sum total of the thickness of the PZT layer and the thickness of the AlN layer was kept at 2.0 μm. The prepared products are defined as Examples 1 to 8.

As comparative examples, vibration films having the same outer diameter were prepared, each film having a three-layer structure formed of three films in total including (i) a two-layer structure made of a PZT layer and an AlN layer and (ii) an SiO$_2$ film as another flexible film. The SiO$_2$ film was formed to have a thickness of 1.0 μm. The PZT layer was disposed between the AlN layer and the SiO$_2$ film. The PZT layer and the AlN layer were prepared by slightly changing the thickness of the PZT layer and the thickness of the AlN layer in the state where the total sum of the thickness of the PZT layer and the thickness of the AlN layer was kept at 2.0 μm. The prepared produces are defined as Comparative Examples 1 to 6.

In each of Examples 1 to 8 and Comparative Examples 1 to 6, each of the PZT layer and the AlN layer was polarized in the thickness direction. The lower electrode was made of Mo, the intermediate electrode was made of Pt, and the upper electrode was made of Au, in which the thickness of each of these electrodes was 100 nm. The intermediate electrode was formed to extend over the entire surface. Each of the lower electrode and the upper electrode was formed in a circular shape having a diameter of 300 μm.

Then, the resonance frequency of the vibration film in each of Examples 1 to 8 and Comparative Examples 1 to 6 was calculated. Also, the electric potential was calculated, which was generated in each of the PZT layer and the AlN layer by exerting a fixed stress on each of Examples 1 to 8 and Comparative Examples 1 to 6. These results are shown in Tables 1 and 2.

In the calculation examples in Tables 1 and 2, the values shown in Table 4 were used as the material constants of PZT and AlN.

TABLE 1

| | PZT Thickness μm | AlN Thickness μm | SiO$_2$ Thickness μm | Resonance Frequency kHz | Generated Voltage on PZT Film side | Generated Voltage on AlN Film Side |
|---|---|---|---|---|---|---|
| Example 1 | 0.70 | 1.30 | — | 95.0 | 0.8305 | 0.8721 |
| Example 2 | 0.80 | 1.20 | — | 93.3 | 0.9060 | 0.9340 |
| Example 3 | 0.90 | 1.10 | — | 91.9 | 0.9630 | 0.9770 |
| Example 4 | 1.00 | 1.00 | — | 90.6 | 1.0000 | 1.0000 |
| Example 5 | 1.05 | 0.95 | — | 90.1 | 1.0112 | 1.0042 |
| Example 6 | 1.10 | 0.90 | — | 89.5 | 1.0181 | 1.0041 |
| Example 7 | 1.20 | 0.80 | — | 88.4 | 1.0179 | 0.9898 |
| Example 8 | 1.30 | 0.70 | — | 87.4 | 1.0021 | 0.9596 |

TABLE 2

| | PZT Thickness μm | AlN Thickness μm | SiO$_2$ Thickness μm | Resonance Frequency kHz | Generated Voltage on PZT Film side | Generated Voltage on AlN Film Side |
|---|---|---|---|---|---|---|
| Comparative Example 1 | 1.20 | 0.80 | 1.00 | 119.7 | 0.2379 | 0.5492 |
| Comparative Example 2 | 1.10 | 0.90 | 1.00 | 121.2 | 0.2525 | 0.5685 |
| Comparative Example 3 | 1.00 | 1.00 | 1.00 | 122.6 | 02592 | 0.5794 |
| Comparative Example 4 | 0.90 | 1.10 | 1.00 | 124.0 | 0.2610 | 0.5877 |
| Comparative Example 5 | 0.80 | 1.20 | 1.00 | 125.5 | 0.2554 | 0.5876 |
| Comparative Example 6 | 0.70 | 1.30 | 1.00 | 127.1 | 0.2432 | 0.5804 |

In Example 4, the PZT layer has a thickness of 1.00 μm and the AlN layer has a thickness of 1.00 μm. Assuming that the electric potential generated in this Example 4 was defined at 1.0000 as a reference, the voltages generated in other Examples and Comparative Examples were relatively represented based on the magnitude of this electric potential defined as a reference.

(Simulation Results)

As apparent from comparison between Table 1 and. Table 2, in each of Examples 1 to 8 in which the vibration film is mainly formed of only two layers of a PZT layer and an AlN layer, the resonance frequency can be lowered as compared with Comparative Examples 1 to 6.

In each of Examples 1 to 8, the thickness of the entire vibration film can be reduced as compared with those in Comparative Examples 1 to 6. It can be recognized that the vibration film having a reduced thickness has a structure that is more likely to vibrate even if the same pressure is applied thereto. Therefore, the generated voltage is higher in Examples 1 to 8 than in Comparative Examples 1 to 6.

As a method of reducing the thickness of the entire vibration film, it is also conceivable to reduce the thickness of the PZT layer or the AlN layer. However, the piezoelectric film extremely reduced in thickness may generally cause a problem that the piezoelectric property deteriorates. Therefore, it is extremely useful to employ the method of reducing the thickness of the entire vibration film while keeping the thickness of the piezoelectric film, as carried out herein in Examples 1 to 8.

(As to Thickness Ratio of PZT/AlN Layer and Stress Neutral Plane)

As apparent from Table 1, even if a two-layer structure made of a PZT layer and an AlN layer has a fixed total thickness, but if the ratio between the thickness of the PZT layer and the thickness of the AlN layer is different, different voltages are generated. This is a problem that is specific to the vibration film made of two types of piezoelectric bodies as main materials.

Figure 3:
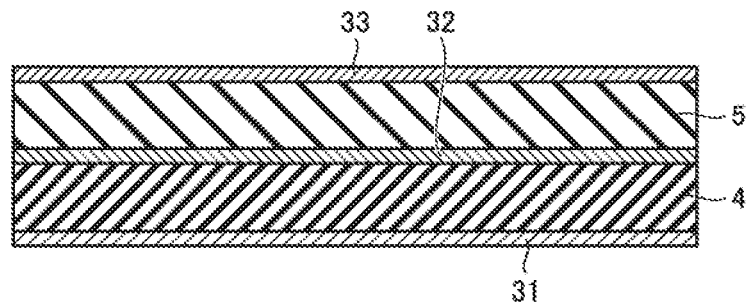
FIG. 3 is a cross-sectional view of the first model having a two-layer structure.
Figure 4:
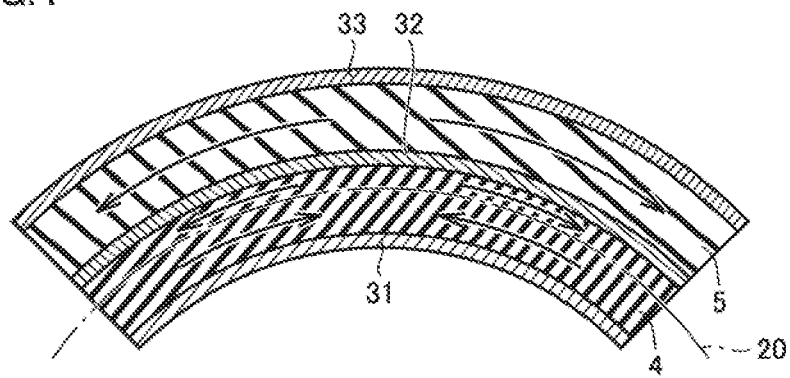
FIG. 4 is an explanatory diagram illustrating the state where the first model is bent.

FIG. 4 shows the state where a two-layer structure made of first piezoelectric layer 4 and second piezoelectric layer 5 as shown in FIG. 3 is bent. A stress neutral plane 20 extends through an intermediate portion of first piezoelectric layer 4. As shown in FIG. 4, when stress neutral plane 20 exists on one of the piezoelectric bodies in an unbalanced manner, efficient vibration cannot be achieved.

Figure 5:
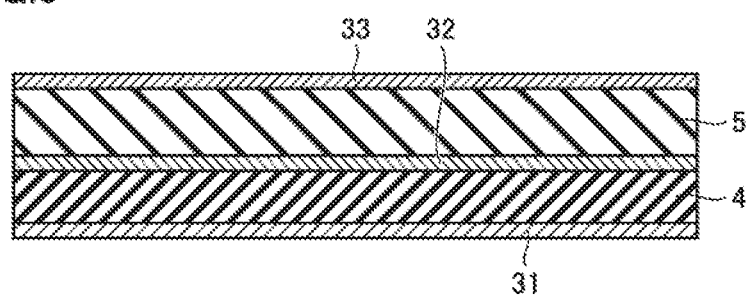
FIG. 5 is a cross-sectional view of the second model having a two-layer structure.
Figure 6:
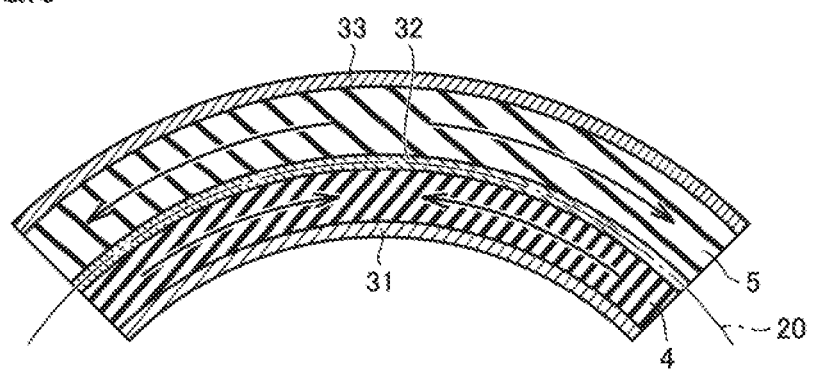
FIG. 6 is an explanatory diagram illustrating the state where the second model is bent.

FIG. 6 shows the state where a two-layer structure made of first piezoelectric layer 4 and second piezoelectric layer 5 as shown in FIG. 5 is bent. As shown in FIG. 6, it is preferable to determine the thickness such that stress neutral plane 20 is located in the vicinity of the interface between the PZT layer as first piezoelectric layer 4 and the AlN layer as second piezoelectric layer 5. Since the AlN layer is higher in Young's modulus than the PZT layer, it is preferable that the PZT layer is formed thicker than the AlN layer. In view of the above, one of first piezoelectric layer 4 and second piezoelectric layer 5 that is lower in relative permittivity in the thickness direction may be thinner than the other of first piezoelectric layer 4 and second piezoelectric layer 5 that is higher in relative permittivity in the thickness direction.

Figure 7:
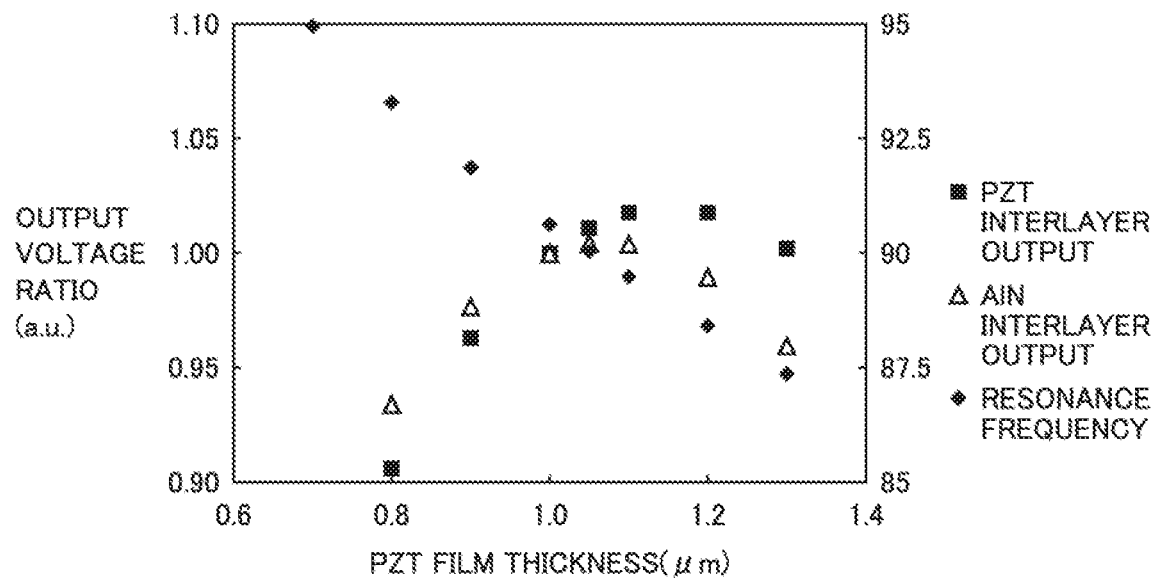
FIG. 7 is a graph showing an output voltage ratio and a resonance frequency that are obtained in each of Examples 1 to 8 shown in Table 1.

FIG. 7 shows a graph plotted from the results of Examples 1 to 8 shown in Table 1. This graph shows that the voltage has a peak when the PZT layer has a thickness greater than 1.0 μm. The vertical axis on the right side in FIG. 7 shows a resonance frequency in unit of kHz.

It is preferable that the piezoelectric device has a stress neutral plane 20 between first piezoelectric layer 4 and second piezoelectric layer 5. Also in this case, one of first piezoelectric layer 4 and second piezoelectric layer 5 that is lower in relative permittivity in the thickness direction may be thinner than the other of first piezoelectric layer 4 and second piezoelectric layer 5 that is higher in relative permittivity in the thickness direction. As shown in FIG. 6, stress neutral plane 20 may be located in intermediate electrode 32. The "relative permittivity in the thickness direction" will be described later in detail.

The piezoelectric device may include an intermediate layer located between first piezoelectric layer 4 and second piezoelectric layer 5, the intermediate layer being mainly made of a material different from those of first piezoelectric layer 4 and second piezoelectric layer 5. Stress neutral plane 20 may be located in this intermediate layer.

For example, the piezoelectric device may include an intermediate layer located between first piezoelectric layer 4 and intermediate electrode 32, the intermediate layer being mainly made off material different from those of first piezoelectric layer 4 and second piezoelectric layer 5. The intermediate layer in this case may be made of SiN, $SiO_2$, $Al_2O_3$, or the like, each of which is an insulating material. Stress neutral plane 20 may be located in this intermediate layer.

The piezoelectric device in the present embodiment may include an intermediate layer located between intermediate electrode 32 and second piezoelectric layer 5, the intermediate layer being mainly made of a material different from those of first piezoelectric layer 4 and second piezoelectric layer 5. The intermediate layer in this case may be made of $LaNiO_3$ that is an oxide having a perovskite structure, or may be made of SiN, $SiO_2$, $Al_2O_3$ or the like, each of which is an insulating material.

When the intermediate layer is too thick, vibration of the vibration film becomes small due to existence of the intermediate layer. Thus, it is preferable that the intermediate layer is formed to have a thickness of 100 nm or less.

(Stacking Order of AlN Layer/PZT Layer)

Depending on the stacking order, effects in manufacturing and design aspects can be achieved, which will be described below.

1. Effects in Manufacturing Aspect

A layer having a two-layer structure is formed by stacking an AlN layer and a PZT layer sequentially in this order, starting from the side close to an Si layer provided as base member 1. When the AlN layer and the PZT layer are stacked in the opposite order, the particles in the PZT layer formed as a film at a high temperature tend to be increased in size, so that the surface of the PZT layer generally becomes coarse. When an AlN layer is stacked on the PZT layer obtained in this way, the surface of the MN layer becomes coarse. Thus, the piezoelectric performance deteriorates. Therefore, it is preferable that an AlN layer is first formed on the Si layer provided as base member 1, and then, a PZT layer is formed thereon.

2. Effect in Design Aspect

Then, the effect obtained in the design aspect will be described. As Example A, a piezoelectric device was prepared by stacking an AlN layer and a PZT layer sequentially in this order on the base member made of Si, starting from the side close to the base member, so as to form a vibration film made of an AlN layer and a PZT layer as main materials. The vibration film was formed to have an outer diameter of 20 μm. Each of the PZT layer and the AlN layer was formed to have a thickness of 1.0 μm.

As Comparative Example B in contrast to Example A, a piezoelectric device was prepared by stacking a PZT layer and an AlN layer sequentially in this order on the base member made of Si, starting from the side close to the base member, so as to form a vibration film made of an AlN layer and a PZT layer as main materials. The vibration film was formed to have an outer diameter of 20 μm. Each of the PZT layer and the AlN layer was formed to have a thickness of 1.0 μm.

For each of Example A and Comparative example B, (i) a resonance frequency; (ii) an amplitude amount at the vibration film obtained when a fixed voltage was applied to the PZT layer; and (iii) an electromechanical coupling coefficient obtained as a vibrator were calculated. The results are shown in Table 3. It is to be noted that each amplitude amount is represented relatively based on the value in Comparative Example B defined as 1.000.

TABLE 3

| | Stacking Order | Resonance Frequency MHz | Amplitude | Electromechanical Coupling Coefficient % |
|---|---|---|---|---|
| Example A | PZT/AlN/Si | 35.8 | 1.494 | 33.9 |
| Comparative Example B | AlN/PZT/Si | 37.4 | 1.000 | 24.3 |

As apparent from Table 3, in the case of a piezoelectric device in Example A in which a PZT layer exists on an AlN layer, the resonance frequency is hardly different from that in Comparative Example B in which an AlN layer exists on a PZT layer, but the amplitude is about 1.5 times higher and the electromechanical coupling coefficient is also higher than those in Comparative Example B. In other words, the characteristics as a piezoelectric device are greatly different depending on the order of stacking a PZT layer and an AlN layer.

The theory of causing the above-described difference may be conceivable as below. First, in both Example A and Comparative Example B, the vibration mode by bending vibration is employed for a piezoelectric device. In such a vibration mode, theoretically, the base portion of the vibration film does not vibrate. However, the piezoelectric actually extends also to a portion other than the vibration film, which results in a vibration mode in which vibration leaks to the portion other than the vibration film. In such a case, if a driving piezoelectric film is fixed even at a portion other than the vibration film, vibration is inhibited, thereby causing amplitude attenuation.

In Comparative Example B, a PZT layer, that is, a driving piezoelectric film, is structured to be sandwiched between an AlN layer and a base member that is made of Si. As a result, vibration is inhibited to cause amplitude attenuation, so that the electromechanical coupling coefficient is also decreased. On the other hand, in Example A, only one surface of the driving piezoelectric film is restrained by the AlN layer. Therefore, inhibition of vibration can be minimized, so that the electromechanical coupling coefficient can also be prevented from decreasing.

As described above, as to the order of stacking piezoelectric layers, an AlN layer is first firmed as first piezoelectric layer 4 on the base member, and then, a PZT layer is formed as second piezoelectric layer 5 so as to cover the AlN layer from above, which is more excellent in performance than when the layers are stacked in the opposite order. In other words, it is preferable that second piezoelectric layer 5 is higher in relative permittivity in the thickness direction than first piezoelectric layer 4.

(Modifications)

Figure 8:
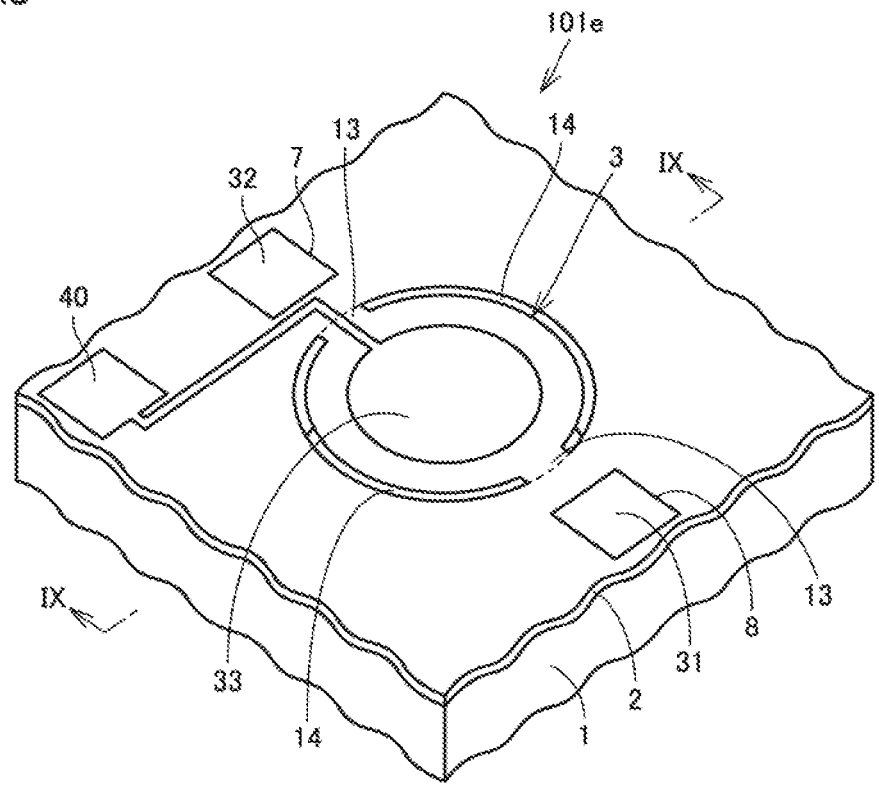
FIG. 8 is a perspective view of a modification of the piezoelectric device in the first embodiment according to the present invention.
Figure 9:
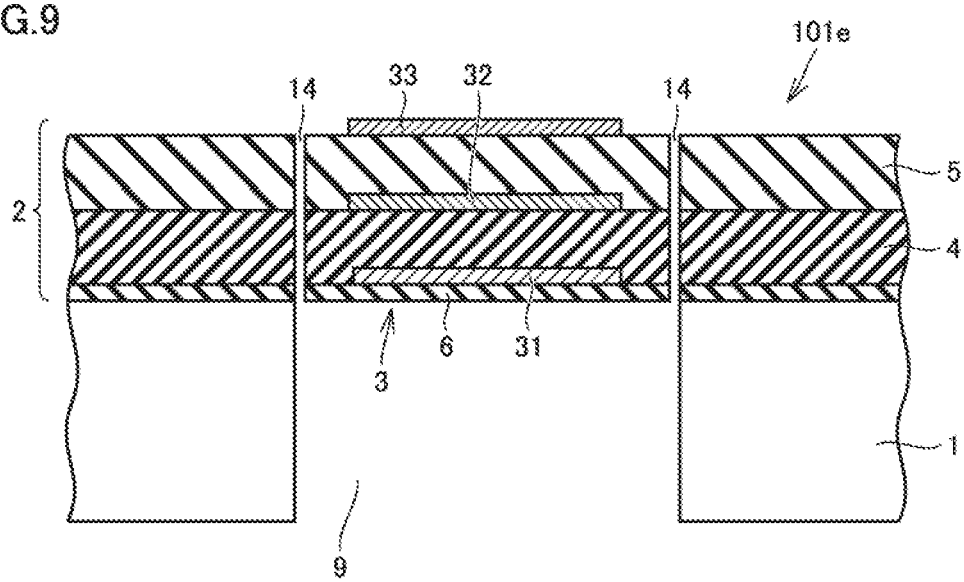
FIG. 9 is a cross-sectional view taken along an arrow line IX-IX in FIG. 8.

Referring to FIGS. 8 and 9, a modification of the piezoelectric device in the first embodiment according to the present invention will be hereinafter described. FIG. 8 shows a perspective view of a piezoelectric device 101e as this modification, FIG. 9 shows a cross-sectional view taken along an arrow line IX-IX in FIG. 8.

In piezoelectric device 101, the entire outer periphery of vibration portion 3 is connected to a portion other than vibration portion 3 in upper layer 2. On the other hand, in piezoelectric device 101e, the outer periphery of vibration portion 3 is partially provided with a slit 14. The portion serving as vibration portion 3 in upper layer 2 is connected through a connection portion 13 to a portion other than vibration portion 3 in upper layer 2. In this example, connection portion 13 is provided at two positions. Connection portions 13 at two positions are located to face each other. The interconnection electrically connecting upper electrode 33 and pad electrode 40 passes through at least one of these two connection portions 13. Other configurations are the same as those having been described with reference to piezoelectric device 101. The piezoelectric device according to the present invention may have a configuration like that of piezoelectric device 101e.

Second Embodiment

Referring to FIGS. 10 to 18, a method of manufacturing a piezoelectric device in the second embodiment according to the present invention will be hereinafter described. This manufacturing method can be used for obtaining the piezoelectric device described in the first embodiment.

The method of manufacturing a piezoelectric device in the present embodiment includes the steps of: preparing a base member having a main surface; forming a lower electrode so as to partially cover the main surface; forming a first piezoelectric layer so as to cover the lower electrode; forming an intermediate electrode so as to partially cover the first piezoelectric layer; forming a second piezoelectric layer so as to cover the intermediate electrode; forming an upper electrode so as to partially cover the second piezoelectric layer; and partially removing the base member to form a vibration portion corresponding to a portion that does not overlap with the base member as a part of an upper layer formed by stacking the lower electrode, the first piezoelectric layer, the intermediate electrode, the second piezoelectric layer, and the upper electrode. In the upper layer, the first piezoelectric layer and the second piezoelectric layer extend to the vibration portion in the vibration portion and also extend to reach a portion in which the upper layer overlaps with the base member. Each of the steps included in this manufacturing method will be described below in detail.

Figure 10:
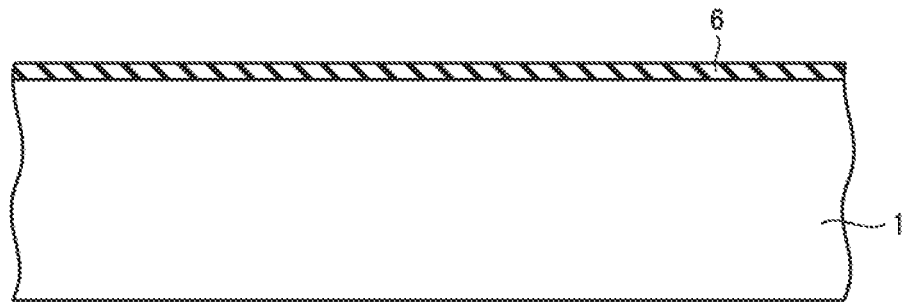
FIG. 10 is an explanatory diagram illustrating the first step of a method of manufacturing a piezoelectric device in the second embodiment according to the present invention.
Figure 11:
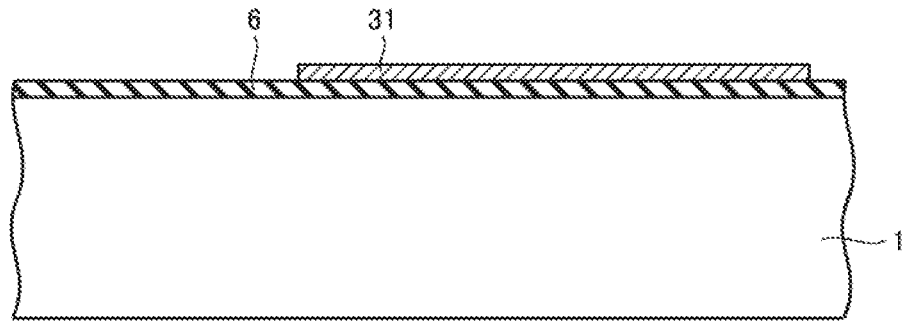
FIG. 11 is an explanatory diagram illustrating the second step of the method of manufacturing a piezoelectric device in the second embodiment according to the present invention.
Figure 12:
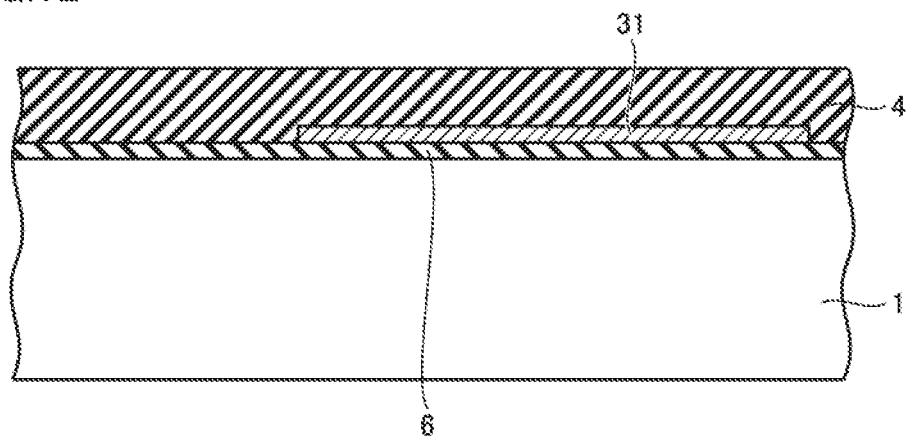
FIG. 12 is an explanatory diagram illustrating the third step of the method of manufacturing a piezoelectric device in the second embodiment according to the present invention.

First, an AlN layer to serve as a protection film 6 is formed by sputtering on the upper surface of an. Si substrate as base member 1 so as to have a thickness of about 100 nm. This leads to formation of protection film 6 on the upper surface of base member 1 as shown in FIG. 10. The AlN layer as protection film 6 is oriented in the (001) direction. The film made of molybdenum as a lower electrode 31 is formed by sputtering on the upper surface of protection film 6 so as to have a thickness of 100 nm, which is then patterned, thereby obtaining the structure shown in FIG. 11. Then, an AlN layer to serve as first piezoelectric layer 4 is formed so as to have a thickness of about 1 μm. The AlN layer as first piezoelectric layer 4 is oriented in the (001) direction. In this way, the structure shown in FIG. 12 is obtained.

Figure 13:
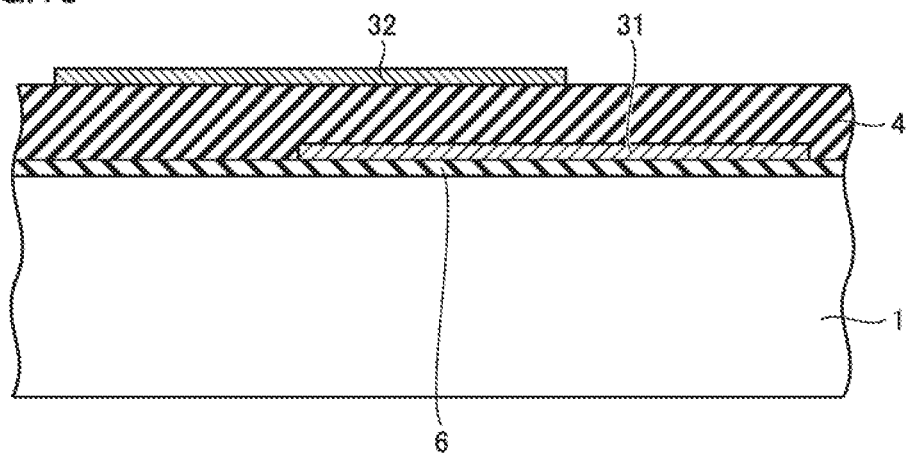
FIG. 13 is an explanatory diagram illustrating the fourth step of the method of manufacturing a piezoelectric device in the second embodiment according to the present invention.

A stacking film of Pt/Ti to serve as intermediate electrode 32 is formed by sputtering so as to have a thickness of about 100 nm/10 nm. The "stacking film of Pt/Ti" means a two-layer structure obtained by first forming a Ti film, on which a Pt film is then formed. In this case, a Ti film is first formed so as to have a thickness of 10 nm, and then, a Pt film is formed thereon so as to have a thickness of 100 nm. Since the AlN layer as first piezoelectric layer 4 is oriented in the (001) direction, the Pt film thrilled on the AlN layer with the Ti film interposed therebetween can also be oriented in the (111) direction with excellent crystallinity. In this way, the structure shown in FIG. 13 is obtained.

Figure 14:
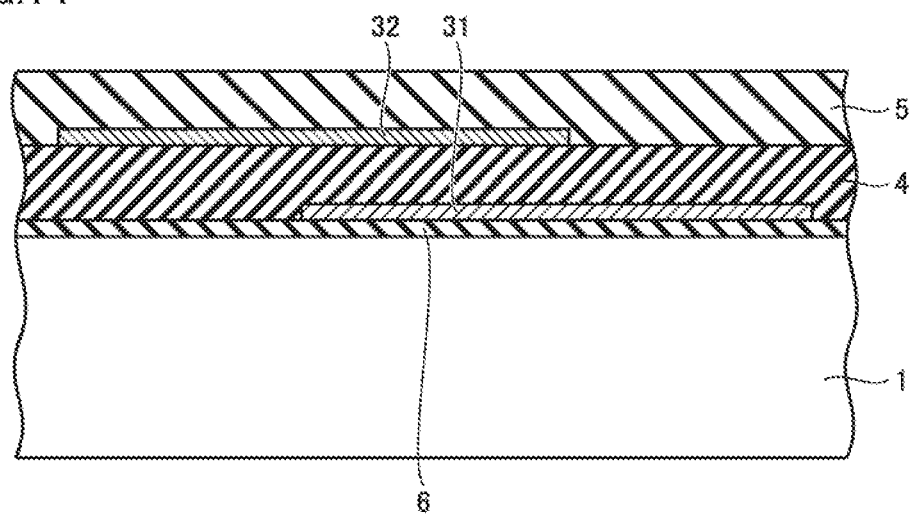
FIG. 14 is an explanatory diagram illustrating the fifth step of the method of manufacturing a piezoelectric device in the second embodiment according to the present invention.

A. PZT layer is thrilled as second piezoelectric layer 5 so as to have a thickness of about 1.1 μm. PZT is formed as a film by the sol-gel method or by sputtering. Each of these processes requires a high temperature of about 700° C., which however does not cause a problem because AlN used as protection film 6 and first piezoelectric layer 4 maintains stability even at a high temperature, and also has an expansion coefficient relatively close to that of Si. Since the Pt film serving as a base film for forming a PZT layer is excellent in crystallinity, the PZT layer is also improved in crystallinity. In this way, the structure shown in FIG. 14 is obtained.

Figure 15:
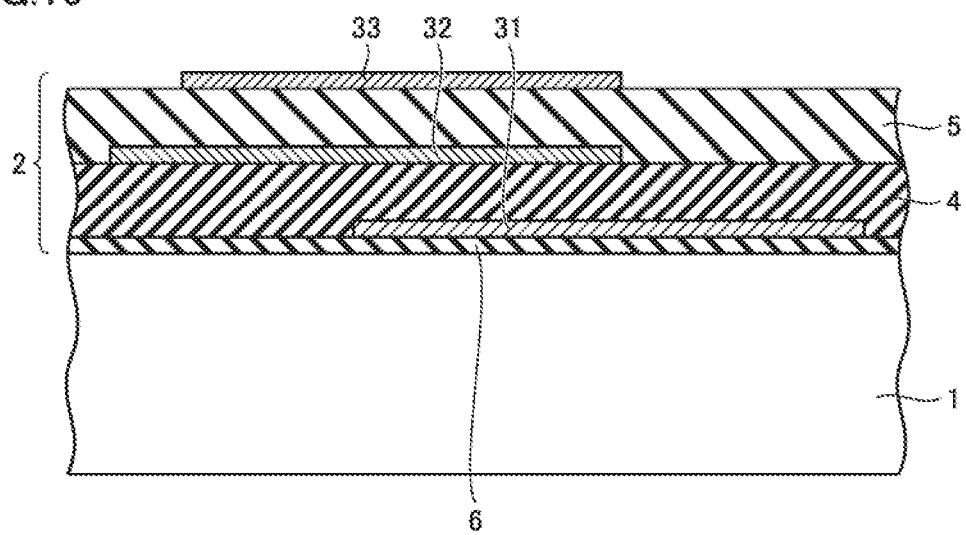
FIG. 15 is an explanatory diagram illustrating the sixth step of the method of manufacturing a piezoelectric device in the second embodiment according to the present invention.

As upper electrode 33, a film such as Al is formed to have a thickness of about 100 nm. In this way, the structure shown in FIG. 15 is obtained. At this point of time, upper layer 2 is formed on the upper side abase member 1.

Figure 16:
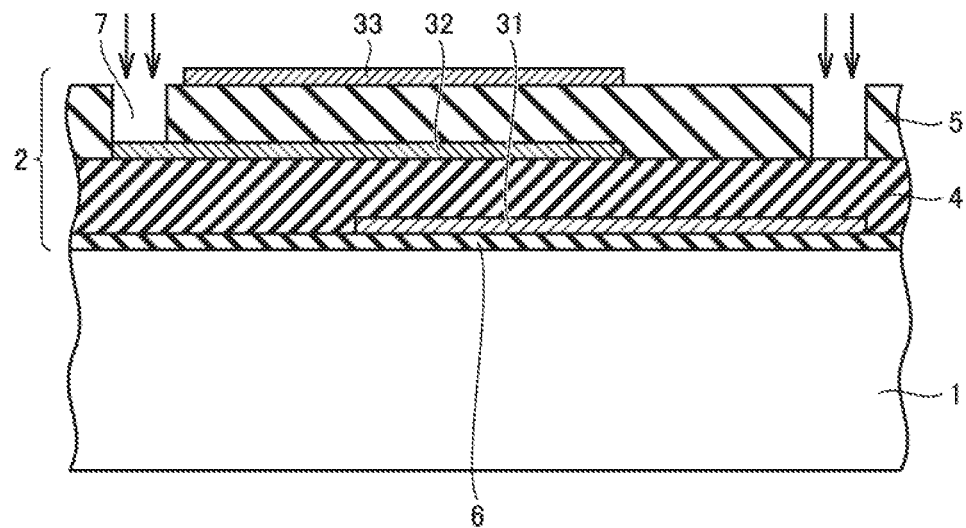
FIG. 16 is an explanatory diagram illustrating the seventh step of the method of manufacturing a piezoelectric device in the second embodiment according to the present invention.

As shown in FIG. 16, second piezoelectric layer 5 is etched to thereby form a through hole 7. In this way, intermediate electrode 32 is exposed at the bottom of through hole 7. At this time, a through hole is formed in second piezoelectric layer 5 simultaneously also in the region corresponding to a through hole 8, which is to be formed later.

Figure 17:
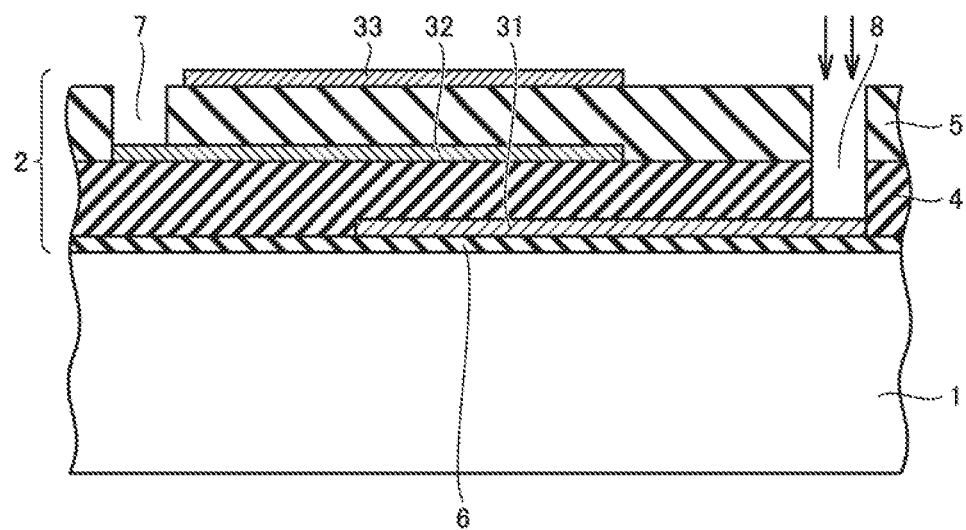
FIG. 17 is an explanatory diagram illustrating the eighth step of the method of manufacturing a piezoelectric device in the second embodiment according to the present invention.

As shown in FIG. 17, first piezoelectric layer 4 is etched to thereby form a through hole. Thus, a through hole 8 penetrating collectively through second piezoelectric layer 5 and first piezoelectric layer 4 is formed. In this way, lower electrode 31 is exposed at the bottom of through hole 8.

Electric extraction of intermediate electrode 32 and lower electrode 31 can be performed via through holes 7 and 8, respectively.

Figure 18:
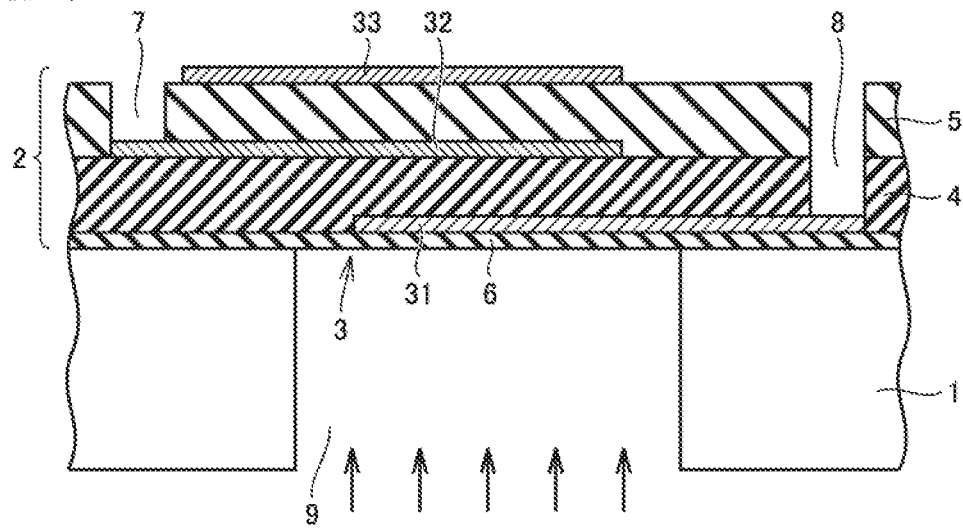
FIG. 18 is an explanatory diagram illustrating the ninth step of the method of manufacturing a piezoelectric device in the second embodiment according to the present invention.

As shown in FIG. 18, an opening 9 is formed in base member 1 by performing Deep Reactive Ion Etching (DRIE) from the back surface of base member 1. This leads to formation of vibration portion 3 as a part of upper layer 2 so as not to overlap with base member 1.

In the present embodiment, a piezoelectric device having excellent crystallinity, having a flat structure and exhibiting excellent characteristics can be provided.

Third Embodiment

Figure 19:
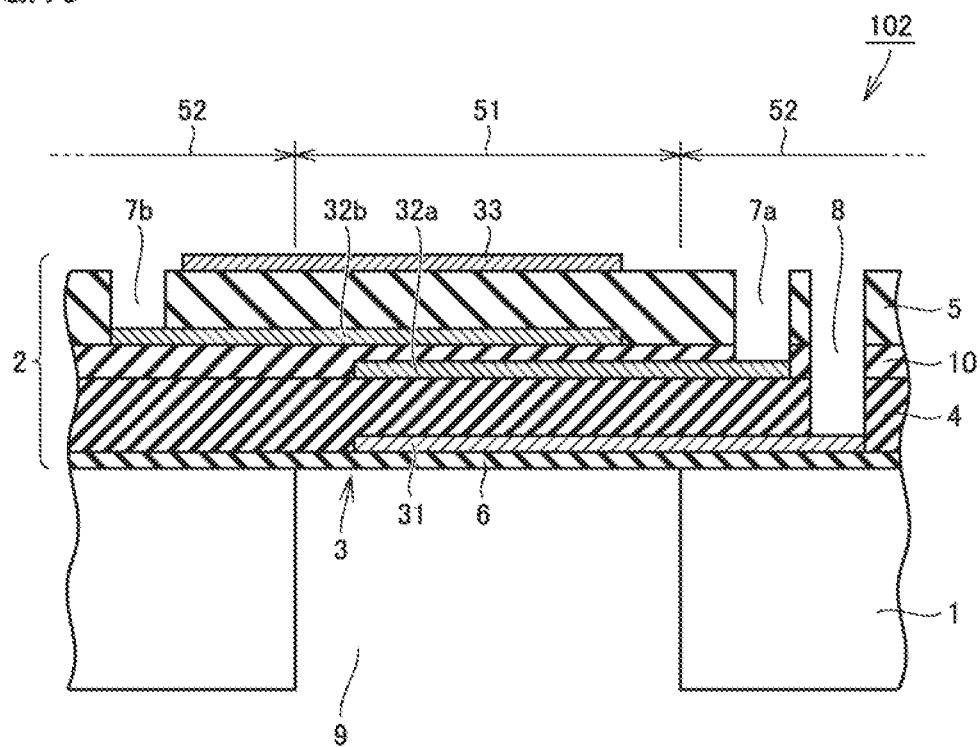
FIG. 19 is a cross-sectional view of a piezoelectric device in the third embodiment according to the present invention.

Referring to FIG. 19, a piezoelectric device in the third embodiment according to the present invention will be hereinafter described. FIG. 19 shows a cross section of a piezoelectric device 102 in the present embodiment. The basic configuration of piezoelectric device 102 in the present embodiment is the same as that of piezoelectric device 101 described in the first embodiment, but is different therefrom in the following points.

In the present embodiment, an intermediate electrode includes a first intermediate electrode 32a disposed on the side close to lower electrode 31, and a second intermediate electrode 32b disposed on the side close to upper electrode 33. An intermediate protection film 10 is disposed between first intermediate electrode 32a and second intermediate electrode 32b.

The present embodiment can also achieve the same effects as those in the first embodiment. In the present embodiment, a ground electrode can be divided into two parts. Accordingly, when a piezoelectric device is used as a piezoelectric transformer, it can be used as an insulating-type transformer.

In the present embodiment, it is preferable that stress neutral plane 20 is located in one of intermediate electrode 32a, intermediate electrode 32b and intermediate protection film 10, or located so as to extend over more than one of intermediate electrode 32a, intermediate electrode 32b and intermediate protection film 10.

Fourth Embodiment

Referring to FIGS. 20 to 30, a method of manufacturing a piezoelectric device in the fourth embodiment according to the present invention will be hereinafter described. This manufacturing method is for obtaining the piezoelectric device described in the third embodiment.

Figure 20:
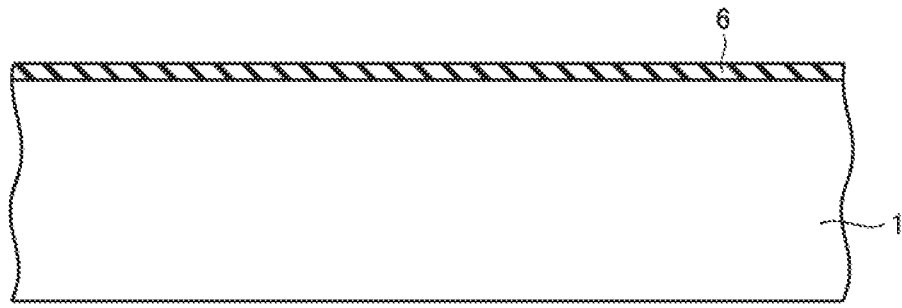
FIG. 20 is an explanatory diagram illustrating the first step of a method of manufacturing a piezoelectric device in the fourth embodiment according to the present invention.
Figure 21:
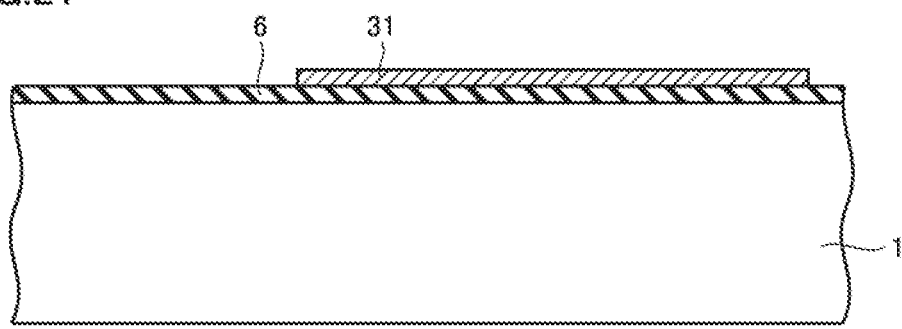
FIG. 21 is an explanatory diagram illustrating the second step of the method of manufacturing a piezoelectric device in the fourth embodiment according to the present invention.
Figure 22:
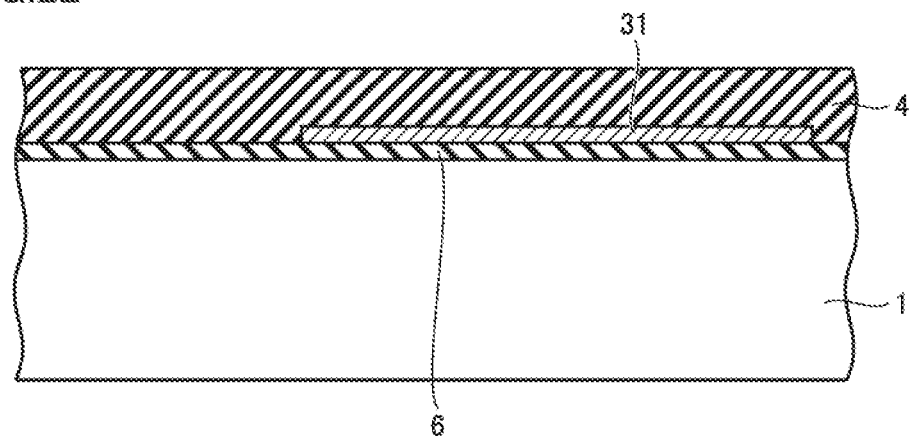
FIG. 22 is an explanatory diagram illustrating the third step of the method of manufacturing a piezoelectric device in the fourth embodiment according to the present invention.

First, an AlN layer to serve as protection film 6 is formed by sputtering on the upper surface of an Si substrate as base member 1 so as to have a thickness of about 100 nm. In this way, protection film 6 is formed on the upper surface of base member 1 as shown in FIG. 20. The AlN layer as protection film 6 is oriented in the (001) direction. On the upper surface of protection film 6, a film made of molybdenum as lower electrode 31 is formed by sputtering to have a thickness of 100 nm, which is then patterned. In this way, the structure shown in FIG. 21 is obtained. Then, an AlN layer to serve as first piezoelectric layer 4 is formed to have a thickness of about 1 μm. The AlN layer as first piezoelectric layer 4 is oriented in the (001) direction. In this way, the structure shown in FIG. 22 is obtained.

Figure 23:
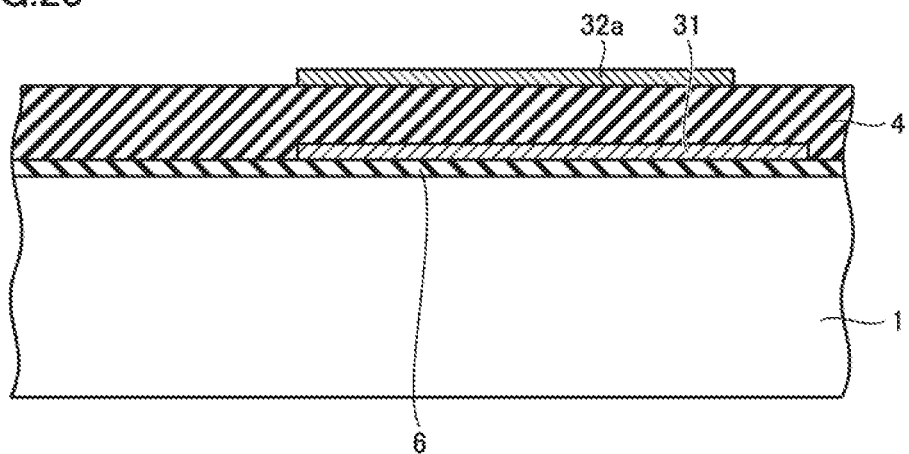
FIG. 23 is an explanatory diagram illustrating the fourth step of the method of manufacturing a piezoelectric device in the fourth embodiment according to the present invention.
Figure 24:
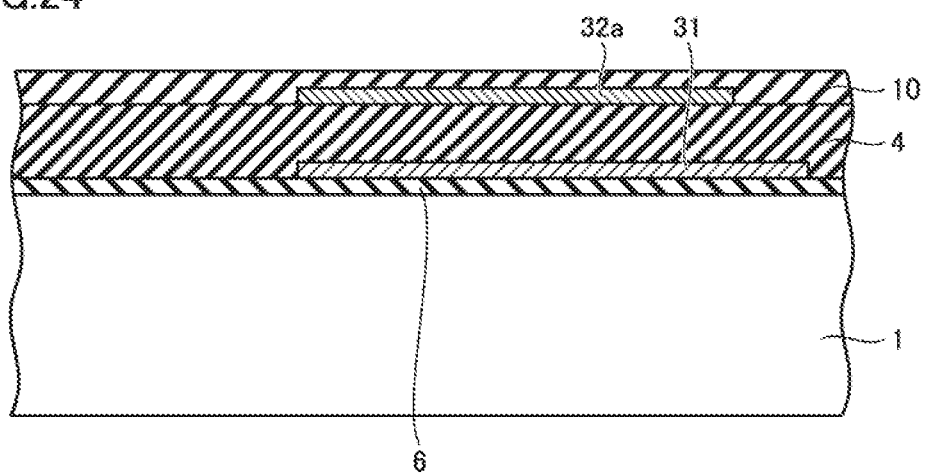
FIG. 24 is an explanatory diagram illustrating the fifth step of the method of manufacturing a piezoelectric device in the fourth embodiment: according to the present invention.
Figure 25:
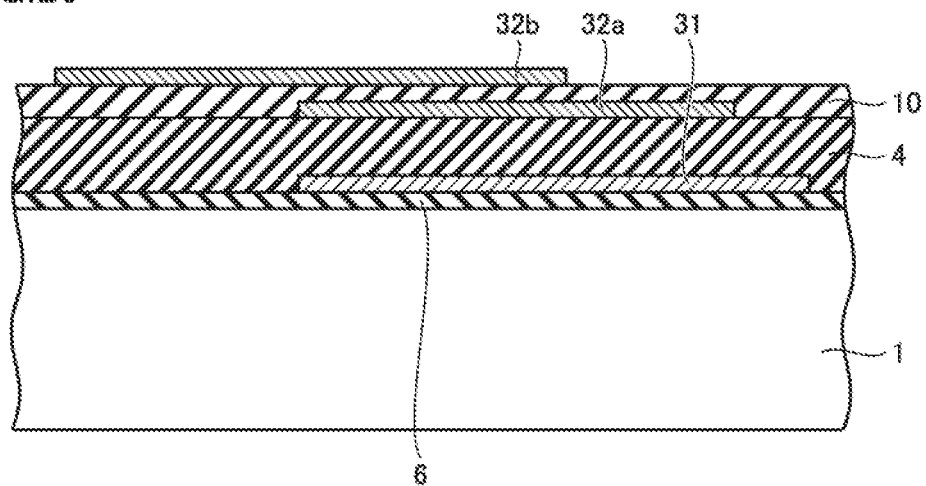
FIG. 25 is an explanatory diagram illustrating the sixth step of the method of manufacturing a piezoelectric device in the fourth embodiment according to the present invention.

Then, a molybdenum film is formed as intermediate electrode 32a so as to have a thickness of about 100 nm, which is then patterned. In this way, the structure shown in FIG. 23 is obtained. Then, an AlN layer as intermediate protection film 10 is formed to have a thickness of about 100 nm. In this way, the structure shown in FIG. 24 is obtained. This AlN layer is oriented in the (001) direction. Then, a stacking film of Pt/Ti as intermediate electrode 32b is formed by sputtering so as to have a thickness of about 100 nm/10 nm. In this way, the structure shown in FIG. 25 is obtained. Since the AlN layer as intermediate protection film 10 is oriented in the (001) direction, the Pt film to serve as a part of intermediate electrode 32b can also be oriented in the (111) direction with excellent crystallinity.

Figure 26:
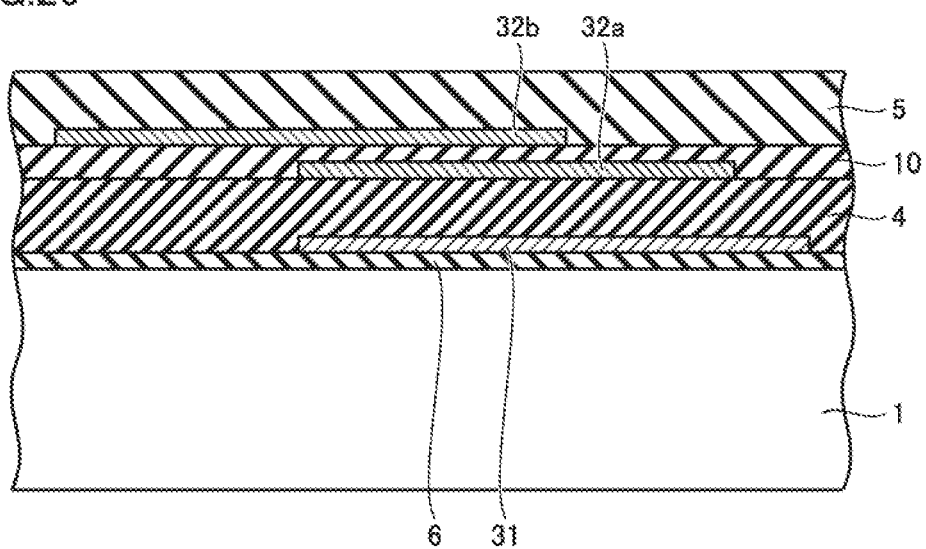
FIG. 26 is an explanatory diagram illustrating the seventh step of the method of manufacturing a piezoelectric device in the fourth embodiment according to the present invention.

Then, a PZT layer is formed as second piezoelectric layer 5 so as to have a thickness of about 1.1 μm. PZT is formed as a film by the sol-gel method or by sputtering. Each of these processes requires a high temperature of about 700° C., which however does not cause a problem because AlN used as protection film 6 and first piezoelectric layer 4 maintains stability even at a high temperature, and also has an expansion coefficient relatively close to that of Si. Since the Pt film serving as a base film for forming a PZT layer is excellent in crystallinity, the PZT layer is also improved in crystallinity. In this way, the structure shown in FIG. 26 is obtained. In addition, if the molybdenum film as intermediate electrode 32a is not protected by AlN as intermediate protection film 10, this molybdenum film is to sublimate at a high temperature of 700° C. Thus, intermediate protection film 10 is indispensable.

Figure 27:
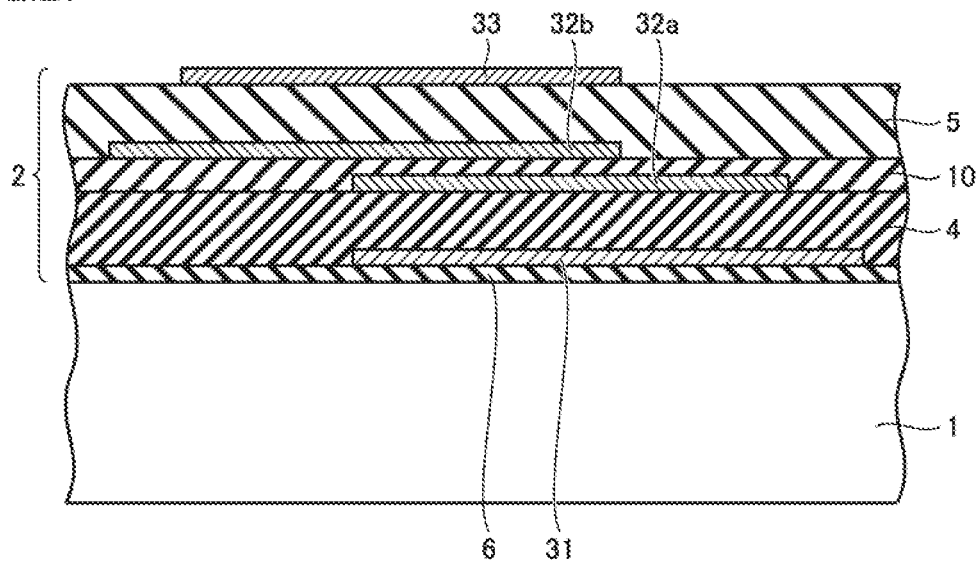
FIG. 27 is an explanatory diagram illustrating the eighth step of the method of manufacturing a piezoelectric device in the fourth embodiment according to the present invention.

Then, a film such as Al is formed as upper electrode 33 so as to have a thickness of about 100 nm. In this way, the structure shown in FIG. 27 is obtained. At this point of time, upper layer 2 is formed on the upper side of base member 1.

Figure 28:
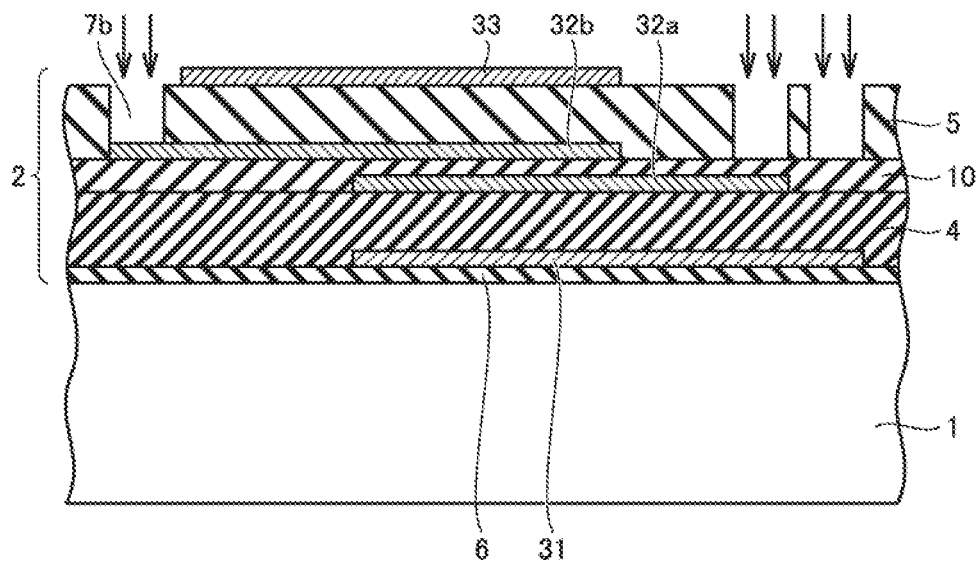
FIG. 28 is an explanatory diagram illustrating the ninth step of the method of manufacturing a piezoelectric device in the fourth embodiment according to the present invention.

As shown in FIG. 28, second piezoelectric layer 5 is etched so as to form a through hole 7b. In this way, intermediate electrode 32b is exposed at the bottom of through hole 7b. At this time, a through hole is formed in second piezoelectric layer 5 simultaneously also in the region corresponding to each of through holes 7a and 8, which are to be formed later.

Figure 29:
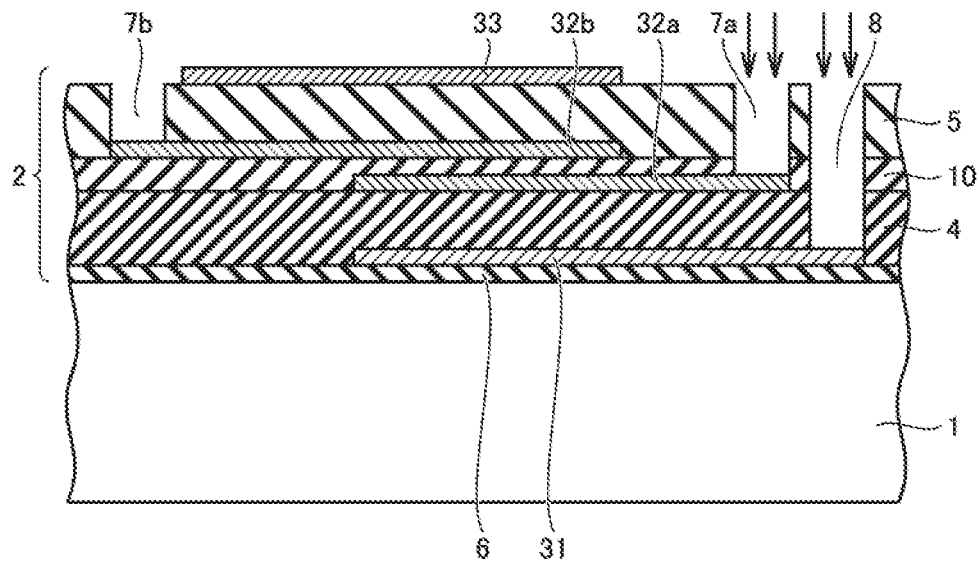
FIG. 29 is an explanatory diagram illustrating the tenth step of the method of manufacturing a piezoelectric device in the fourth embodiment according to the present invention.

As shown in FIG. 29, intermediate protection film 10 is etched to thereby form a through hole 7a. In this way, intermediate electrode 32a is exposed at the bottom of through hole 7a. At this time, a through hole is formed in intermediate protection film 10 simultaneously also in the region corresponding to a through hole 8, which is to be formed later. Each of intermediate protection film 10 and first piezoelectric layer 4 is formed by AlN. Accordingly, when a through hole is formed m intermediate protection film 10, a through hole can be subsequently formed in first piezoelectric layer 4. In this way, a through hole 8 is formed as shown in FIG. 29. Thus, lower electrode 31 is exposed at the bottom of through hole 8.

Electric extraction of intermediate electrode 32b, intermediate electrode 32a and lower electrode 31 can be performed via through holes 7b, 7a and 8, respectively.

Figure 30:
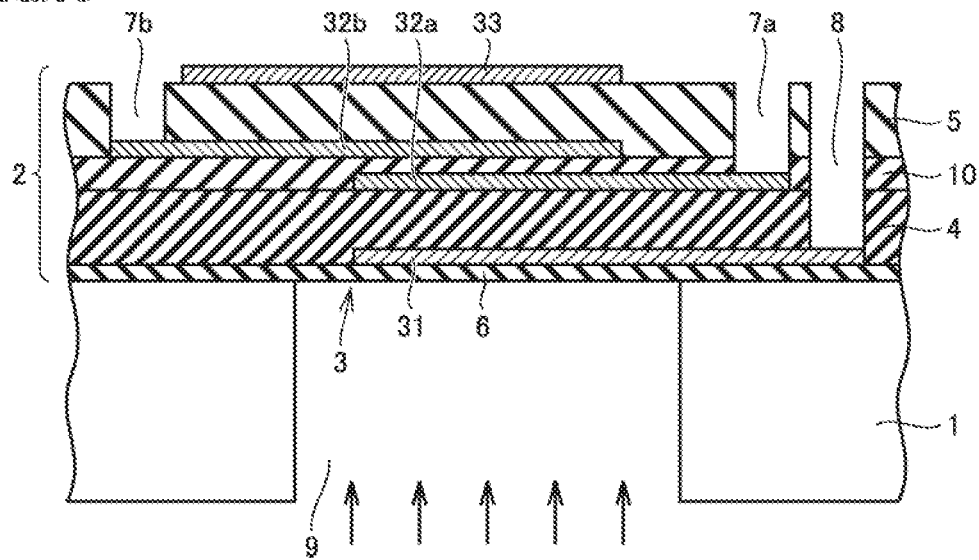
FIG. 30 is an explanatory diagram illustrating the eleventh step of the method of manufacturing a piezoelectric device in the fourth embodiment according to the present invention.

As shown in FIG. 30, an opening 9 is formed in base member 1 by performing Deep Reactive Ion Etching (DRIE) from the back surface of base member 1. This leads to formation of vibration portion 3 provided as a part of upper layer 2 so as not to overlap with base member 1.

Fifth Embodiment

Figure 31:
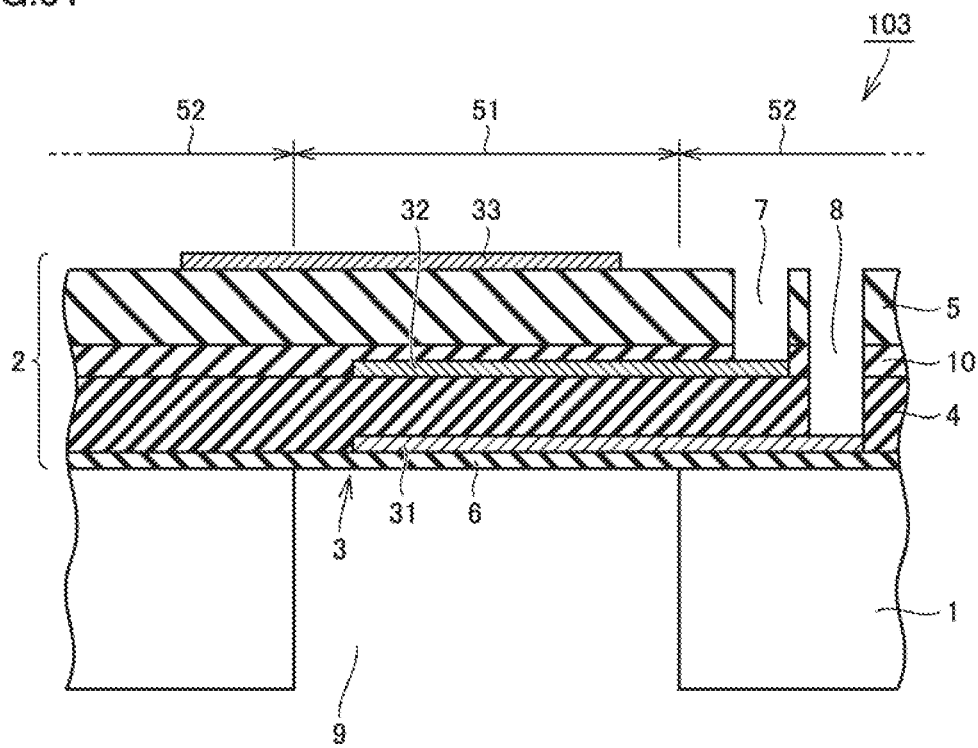
FIG. 31 is a cross-sectional view of a piezoelectric device in the fifth embodiment according to the present invention.

Referring to FIG. 31, a piezoelectric device in the fifth embodiment according to the present invention will be hereinafter described. FIG. 31 shows a cross section of a piezoelectric device 103 in the present embodiment. The basic configuration of piezoelectric device 103 in the present embodiment is the same as that of piezoelectric device 101 described in the first embodiment, but is different therefrom in the following points.

Intermediate protection film 10 is interposed between first piezoelectric layer 4 and second piezoelectric layer 5. Intermediate electrode 32 is formed so as to partially cover the upper surface of first piezoelectric layer 4. Intermediate electrode 32 is formed of molybdenum. Intermediate protection film 10 covers intermediate electrode 32. Intermediate protection film 10 is formed of AlN. The AlN layer as intermediate protection film 10 is oriented in the (001) direction.

The present embodiment can also achieve the same effects as those in the first embodiment. In the present embodiment, since the AlN layer as intermediate protection film 10 is oriented in the (001) direction, this AlN layer may function as a seed layer when a PZT layer is formed as second piezoelectric layer 5. Accordingly, an excellent PZT layer can be formed. Furthermore, the insulating property of the PZT layer can also be improved.

In the present embodiment, intermediate electrode 32 formed of molybdenum is provided. In this case, an expensive Pt film does not have to be used, and a film made of molybdenum that is lower in resistivity than Pt can be used. Thereby, the characteristics are improved. In the present embodiment, it is preferable that stress neutral plane 20 is located in intermediate electrode 32 or intermediate protection film 10.

Sixth Embodiment

Referring to FIGS. 32 to 41, a method of manufacturing a piezoelectric device in the sixth embodiment according to the present invention will be hereinafter described. This manufacturing method is for obtaining the piezoelectric device described in the fifth embodiment.

Figure 32:
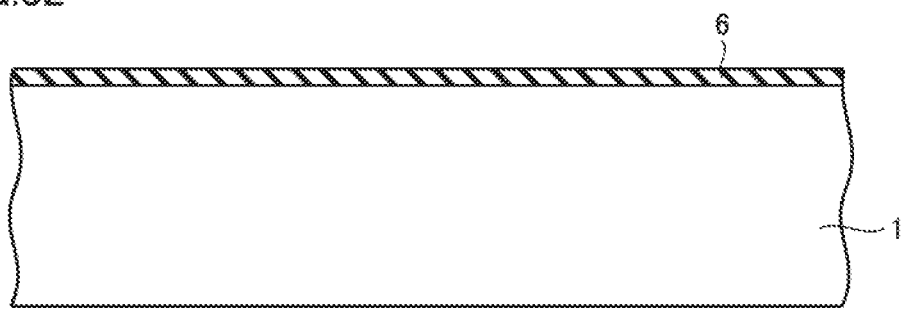
FIG. 32 is an explanatory diagram illustrating the first step of a method of manufacturing a piezoelectric device in the sixth embodiment according to the present invention.
Figure 33:
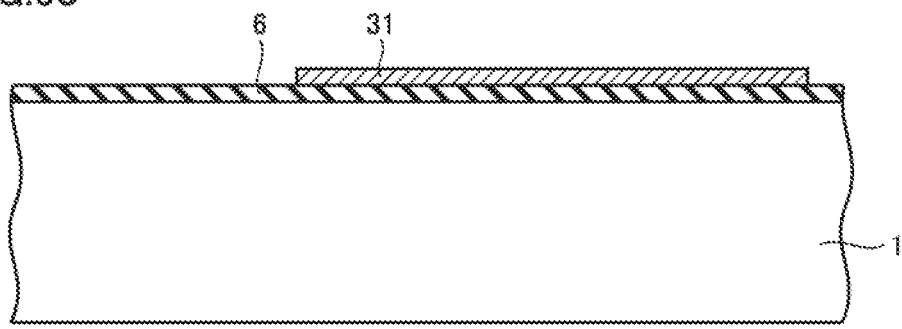
FIG. 33 is an explanatory diagram illustrating the second step of the method of manufacturing a piezoelectric device in the sixth embodiment according to the present invention.
Figure 34:
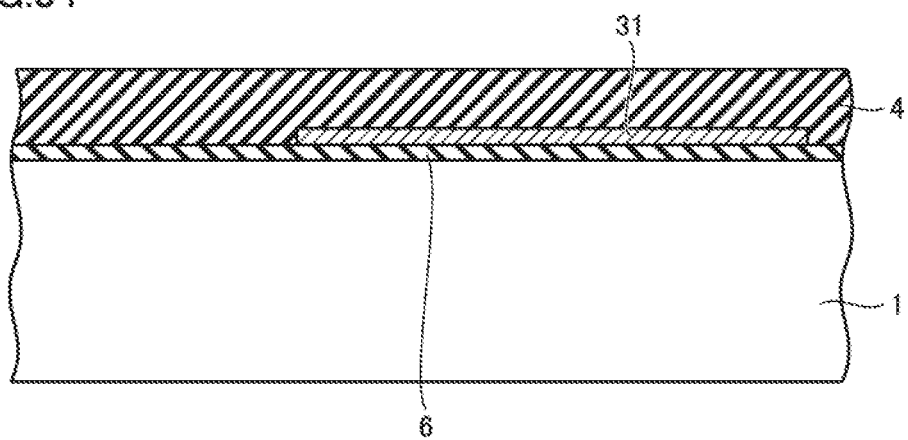
FIG. 34 is an explanatory diagram illustrating the third step of the method of manufacturing a piezoelectric device in the sixth embodiment according to the present invention.

First, an AlN layer to serve as protection film 6 is formed by sputtering on the upper surface of an Si substrate as base member 1 so as to have a thickness of about 100 nm. In this way, protection film 6 is formed on the upper surface of base member 1 as shown in FIG. 32. The AlN layer as protection film 6 is oriented in the (001) direction. Then, a film made of molybdenum as lower electrode 31 is formed on the upper surface of protection film 6 by sputtering so as to have a thickness of 100 nm, which is then patterned. In this way, the structure shown in FIG. 33 is obtained. Then, an AlN layer to serve as first piezoelectric layer 4 is formed so as to have a thickness of about 1 μm. The MN layer as first piezoelectric layer 4 is oriented in the (001) direction. In this way, the structure shown in FIG. 34 is obtained.

Figure 35:
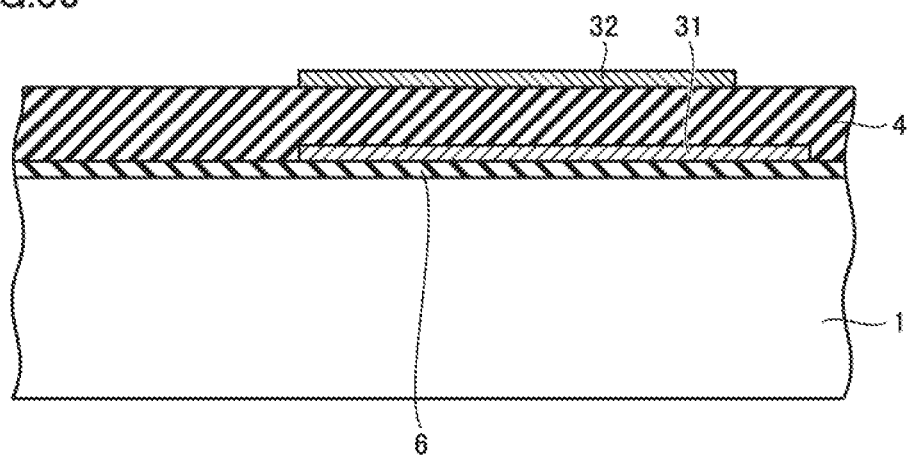
FIG. 35 is an explanatory diagram illustrating the fourth step of the method of manufacturing a piezoelectric device in the sixth embodiment according to the present invention.
Figure 36:
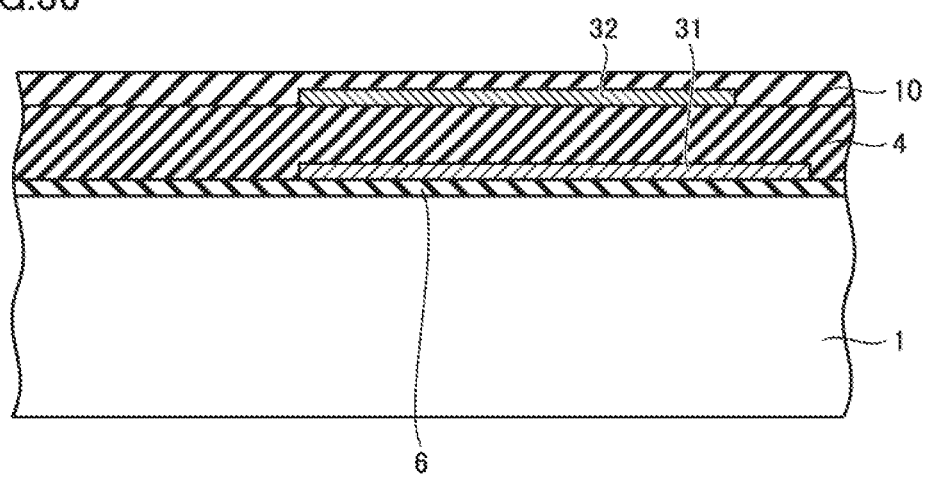
FIG. 36 is an explanatory diagram illustrating the fifth step of the method of manufacturing a piezoelectric device in the sixth embodiment according to the present invention.
Figure 37:
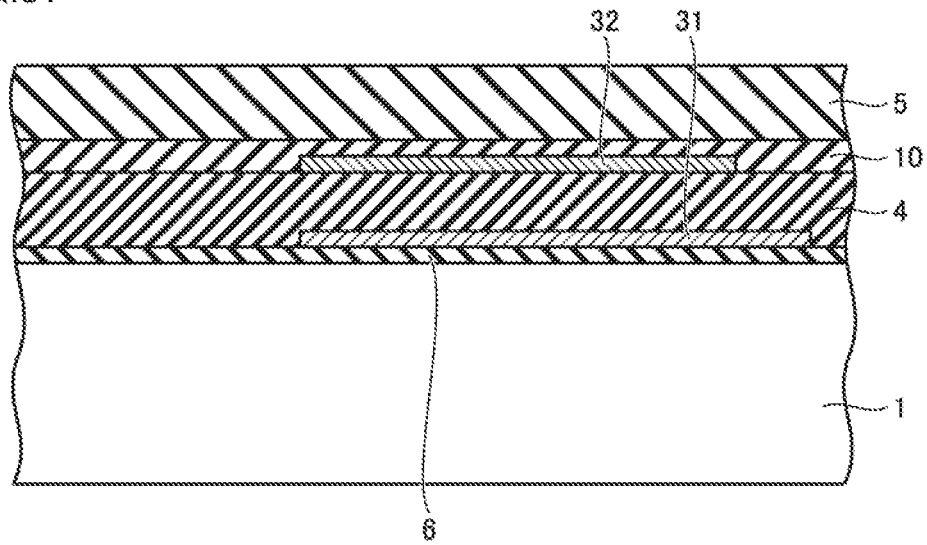
FIG. 37 is an explanatory diagram illustrating the sixth step of the method of manufacturing a piezoelectric device in the sixth embodiment according to the present invention.

Then, a molybdenum film is formed as intermediate electrode 32 so as to have a thickness of about 100 nm, which is then patterned. In this way, the structure shown in FIG. 35 is obtained. Then, an AlN layer as intermediate protection film 10 is formed so as to have a thickness of about 100 nm. In this way, the structure shown in FIG. 36 is obtained. This AlN layer is oriented in the (001) direction.

These AlN layer and molybdenum film are generally formed by the sputtering method at a temperature below 400° C.

All of the above-described AlN layers are oriented in the direction, that is called as (001) orientation. Intermediate protection film 10 is also oriented in (001) direction. Intermediate protection film 10 functions as a seed layer of a PZT layer serving as second piezoelectric layer 5. When a PZT layer is formed on this seed layer, the film formation conditions are controlled, so that the PZT layer can be readily oriented in the (001) direction or the (111) direction. Usually, the PZT layer is formed by the sputtering method or by the sol-gel method. Second piezoelectric layer 5 is formed in this way, thereby obtaining the structure shown in FIG. 37.

Figure 38:
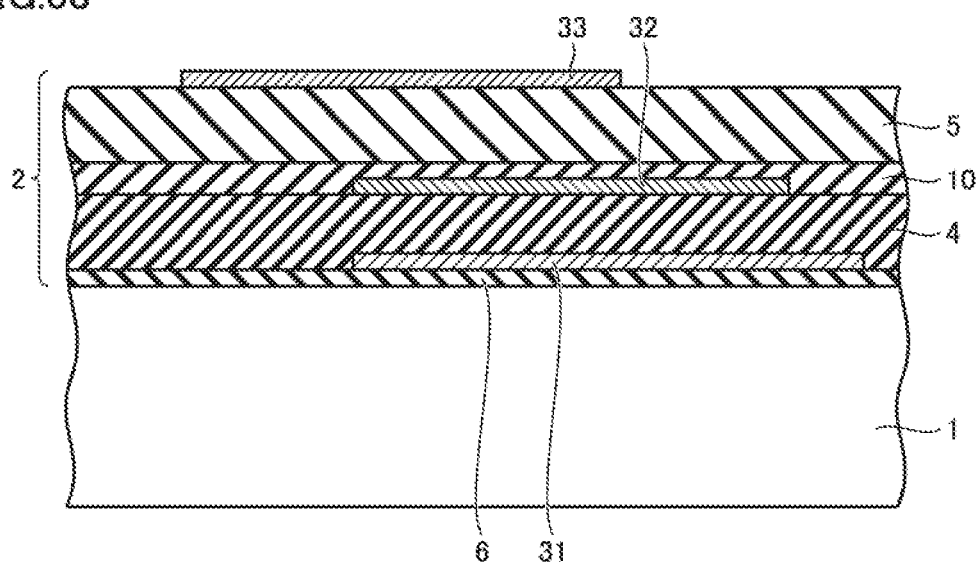
FIG. 38 is an explanatory diagram illustrating the seventh step of the method of manufacturing a piezoelectric device in the sixth embodiment according to the present invention.

Then, upper electrode 33 is formed on the upper surface of second piezoelectric layer 5, which is then patterned. In this way, the structure shown in FIG. 38 is obtained.

Figure 39:
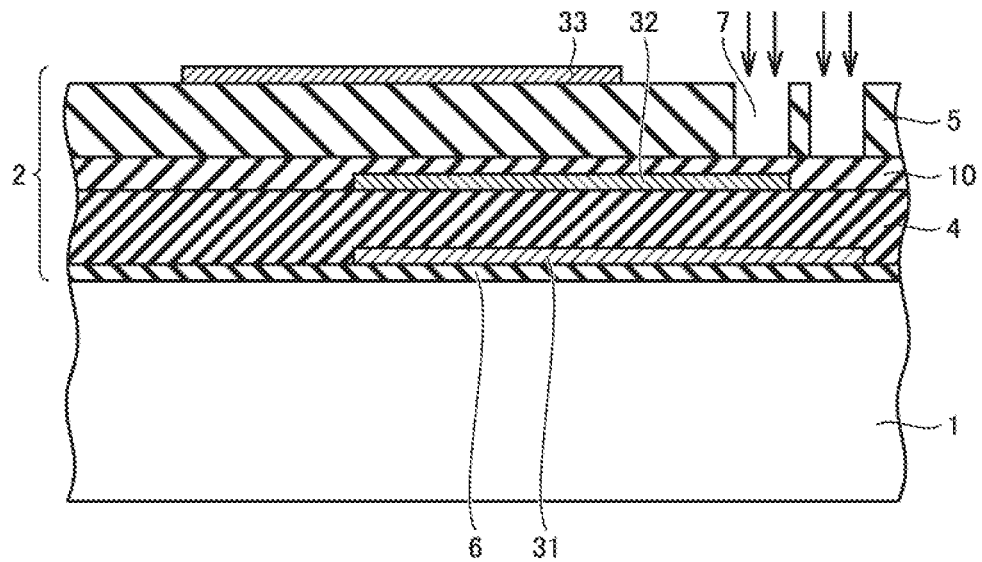
FIG. 39 is an explanatory diagram illustrating the eighth step of the method of manufacturing a piezoelectric device in the sixth embodiment according to die present invention.
Figure 40:
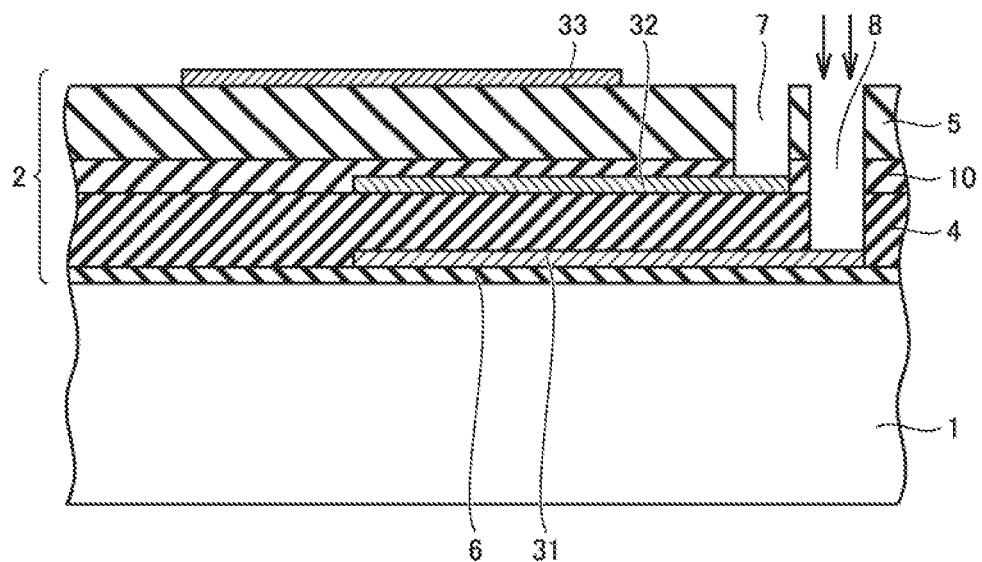
FIG. 40 is an explanatory diagram illustrating the ninth step of the method of manufacturing a piezoelectric device in the sixth embodiment according to the present invention.
Figure 41:
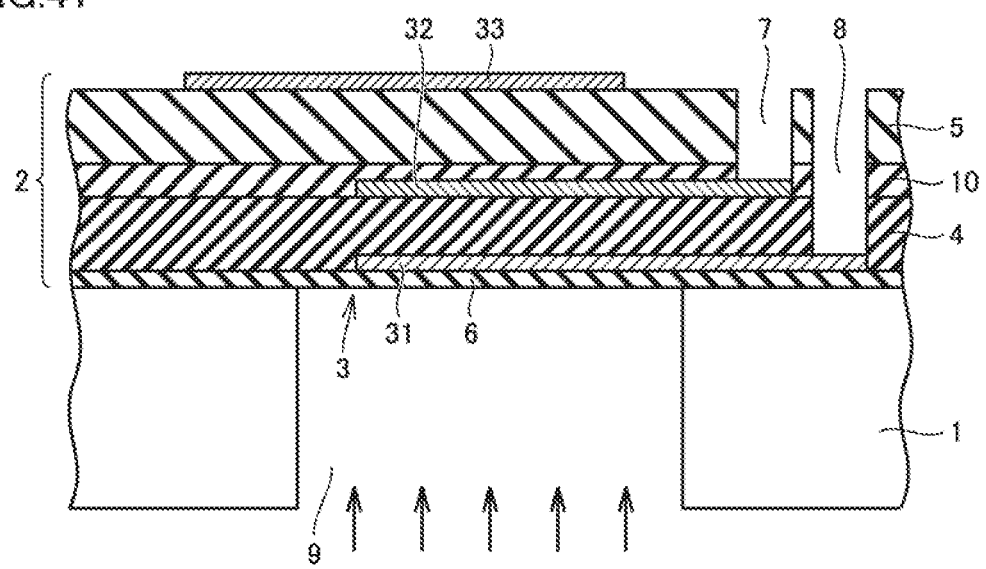
FIG. 41 is an explanatory diagram illustrating the tenth step of the method of manufacturing a piezoelectric device in the sixth embodiment according to the present invention.

As shown in FIGS. 39, 40 and 41, wet etching, dry etching and the like are performed as appropriate, with the result that intermediate electrode 32 and lower electrode 31 are exposed at the bottoms of through holes 7 and 8, respectively.

Seventh Embodiment

Figure 42:
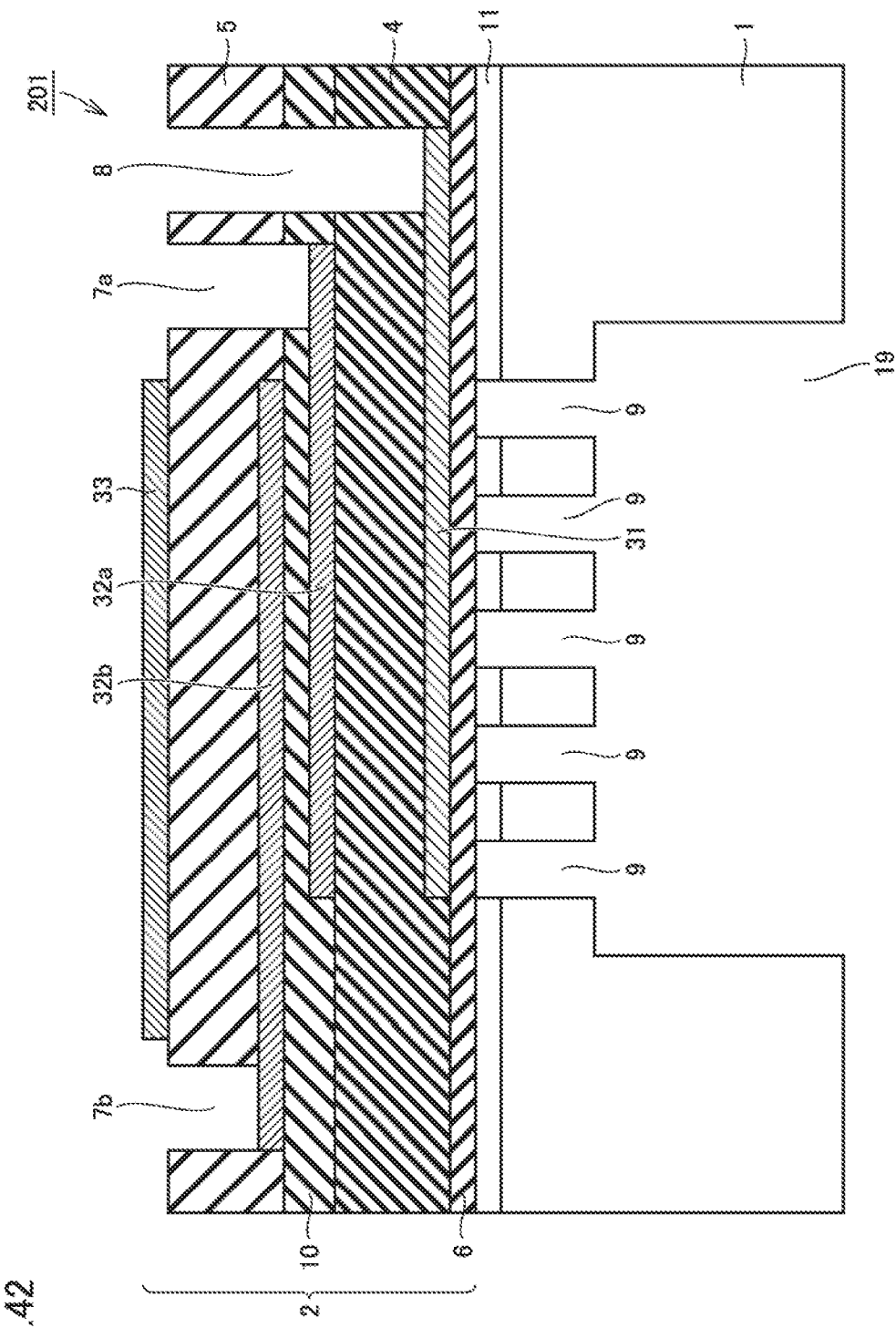
FIG. 42 is a cross-sectional view of a piezoelectric device array in the seventh embodiment according to the present invention.
Figure 43:
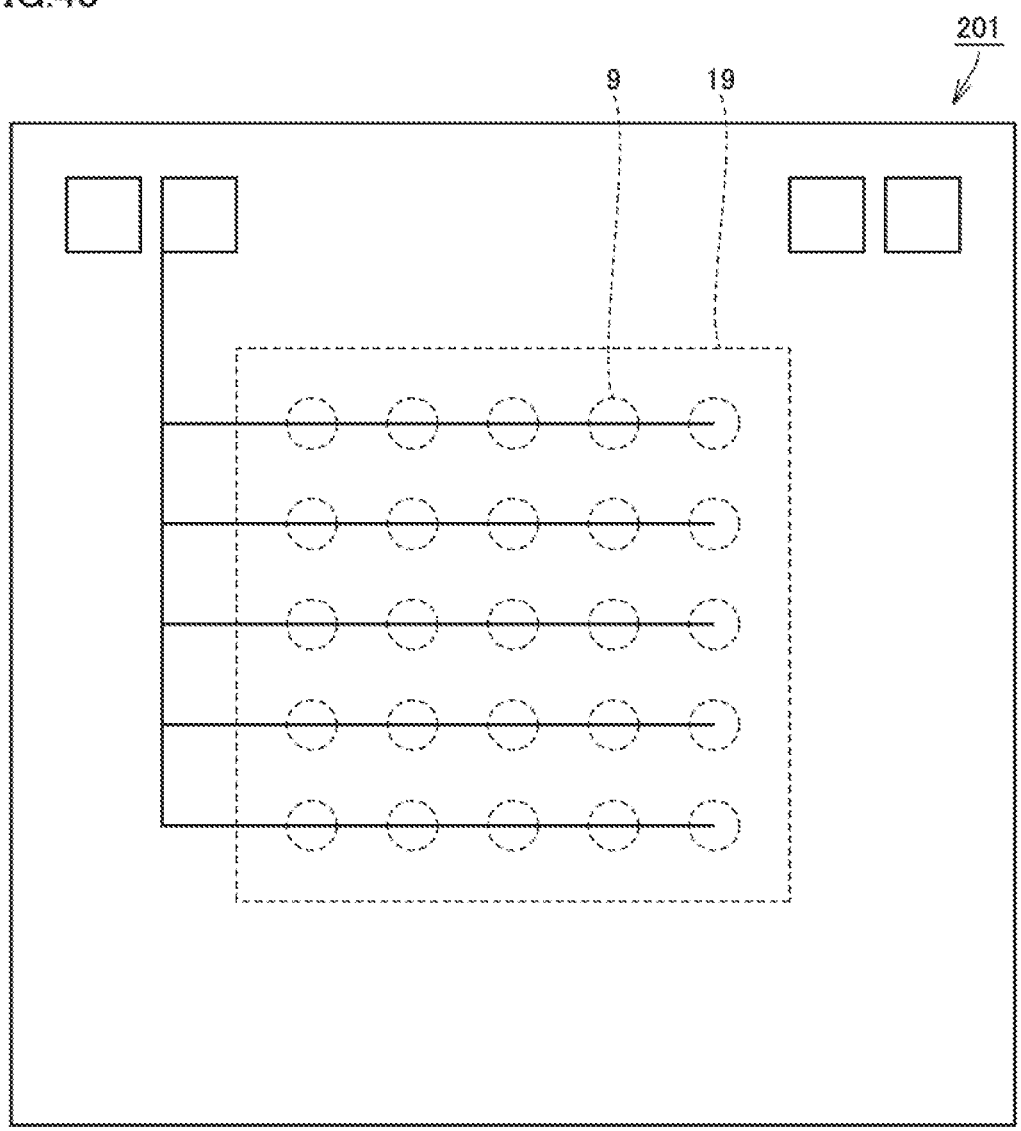
FIG. 43 is a plan view of the piezoelectric device array in the seventh embodiment according to the present invention.

Referring to FIG. 42, a piezoelectric device array in the seventh embodiment according to the present invention will be hereinafter described. FIG. 42 shows a cross section of a piezoelectric device array 201 in the present embodiment. FIG. 43 shows a plan view of piezoelectric device array 201.

Piezoelectric device array 201 in the present embodiment is obtained by arranging a plurality of piezoelectric devices among those described above.

FIG. 42 shows a plurality of openings 9, each of which corresponds to opening 9 shown in FIG. 2 and the like. The portion that does not overlap with base member 1 within the range of one opening 9 corresponds to vibration portion 3. As shown in FIG. 43, 25 (5×5) vibration portions 3 are arranged in piezoelectric device array 201. However, the number of vibration portions 3 in this arrangement and the arrangement pattern are merely by way of example, and not necessarily limited thereto.

Since the present embodiment employs an array type, the performance as a piezoelectric element is improved. The sound pressure is improved for use as an ultrasound element. The power capacity can be increased for use as a piezoelectric transformer. It is effective to form an array in this way, particularly when it is desirable that high-frequency piezoelectric elements with small membrane diameters are densely arranged.

Eighth Embodiment

In the case of a high-frequency piezoelectric element, the vibrator has a small diameter. Accordingly, in the manufacturing method as described above, it was extremely difficult to maintain the alignment accuracy on the upper side and the lower side of base member 1 made of Si. Thus, positional deviation of each electrode was more likely to occur, so that variations between elements tended to increase. Therefore, it was extremely difficult to manufacture a piezoelectric element with excellent efficiency or a piezoelectric element as designed.

The above-described problems can be solved by manufacturing a piezoelectric device array as described in the present embodiments.

Referring to FIGS. 44 to 50, a method of manufacturing a piezoelectric device array in the eighth embodiment according to the present invention will be hereinafter described. This manufacturing method is for obtaining a piezoelectric device array described in the seventh embodiment.

Figure 44:
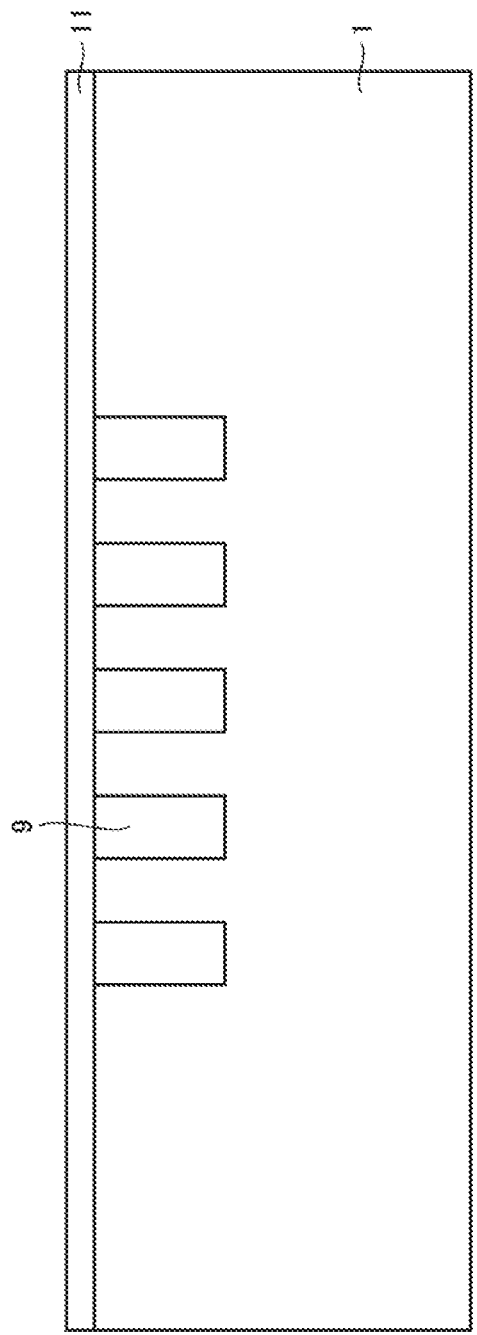
FIG. 44 is a cross-sectional view of the first stage of a method of manufacturing a piezoelectric device array in the eighth embodiment according to the present invention.
Figure 45:
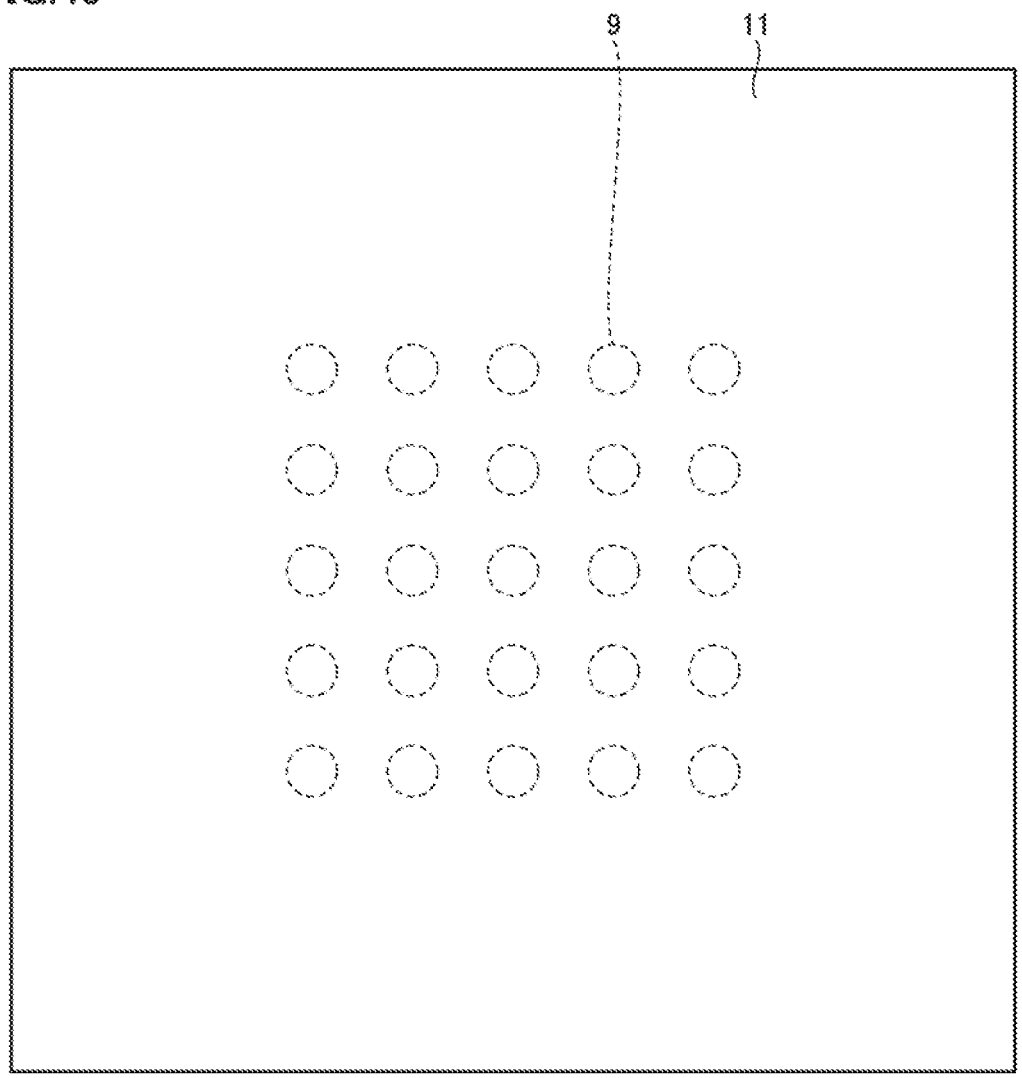
FIG. 45 is a plan view of the first stage of the method of manufacturing a piezoelectric device array in the eighth embodiment according to the present invention.

First, the first stage of the manufacturing method will be hereinafter described. FIG. 44 shows a cross-sectional view and FIG. 45 shows a plan view. First, a hole corresponding to an opening 9 is formed in the upper surface of base member 1 as a silicon (Si) substrate. Opening 9 is designed to have a size that can implement a required resonance frequency (for example, about 20 μm to about 100 μm in diameter). Then, a cover substrate 11 is placed over the upper surface of base member 1. Cover substrate 11 is a silicon substrate prepared separately from base member 1. The substrate having opening 9 whose exit is covered by cover substrate 11 in this way may be generally referred to as a cavity Silicon-on-Insulator (SOI). In the present embodiment, cover substrate 11 has a thickness of 10 μm to 50 μm. Opening 9 has a depth of about 50 μm to 100 μm.

Figure 46:
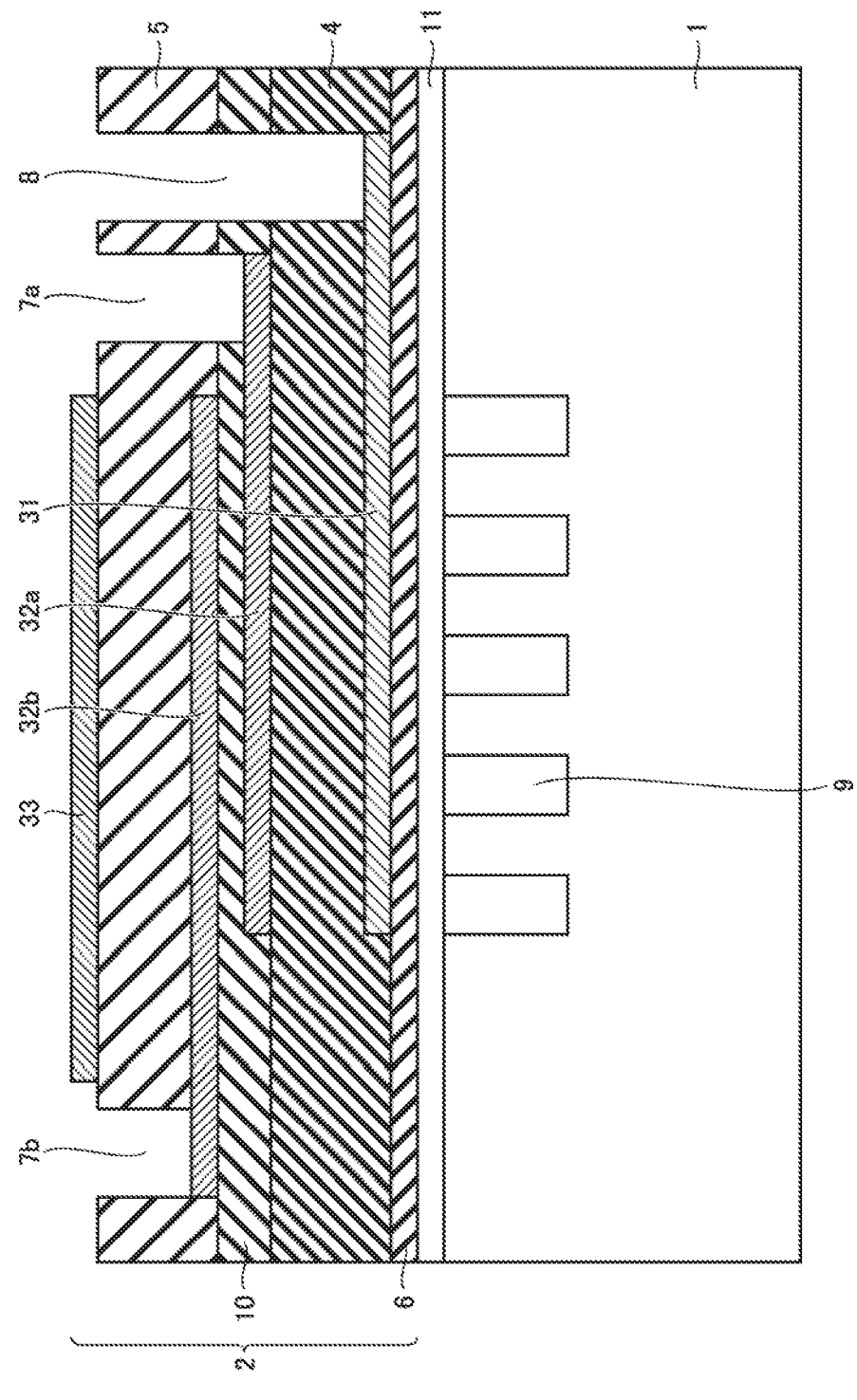
FIG. 46 is a cross-sectional view of the second stage of the method of manufacturing a piezoelectric device array in the eighth embodiment according to the present invention.
Figure 47:
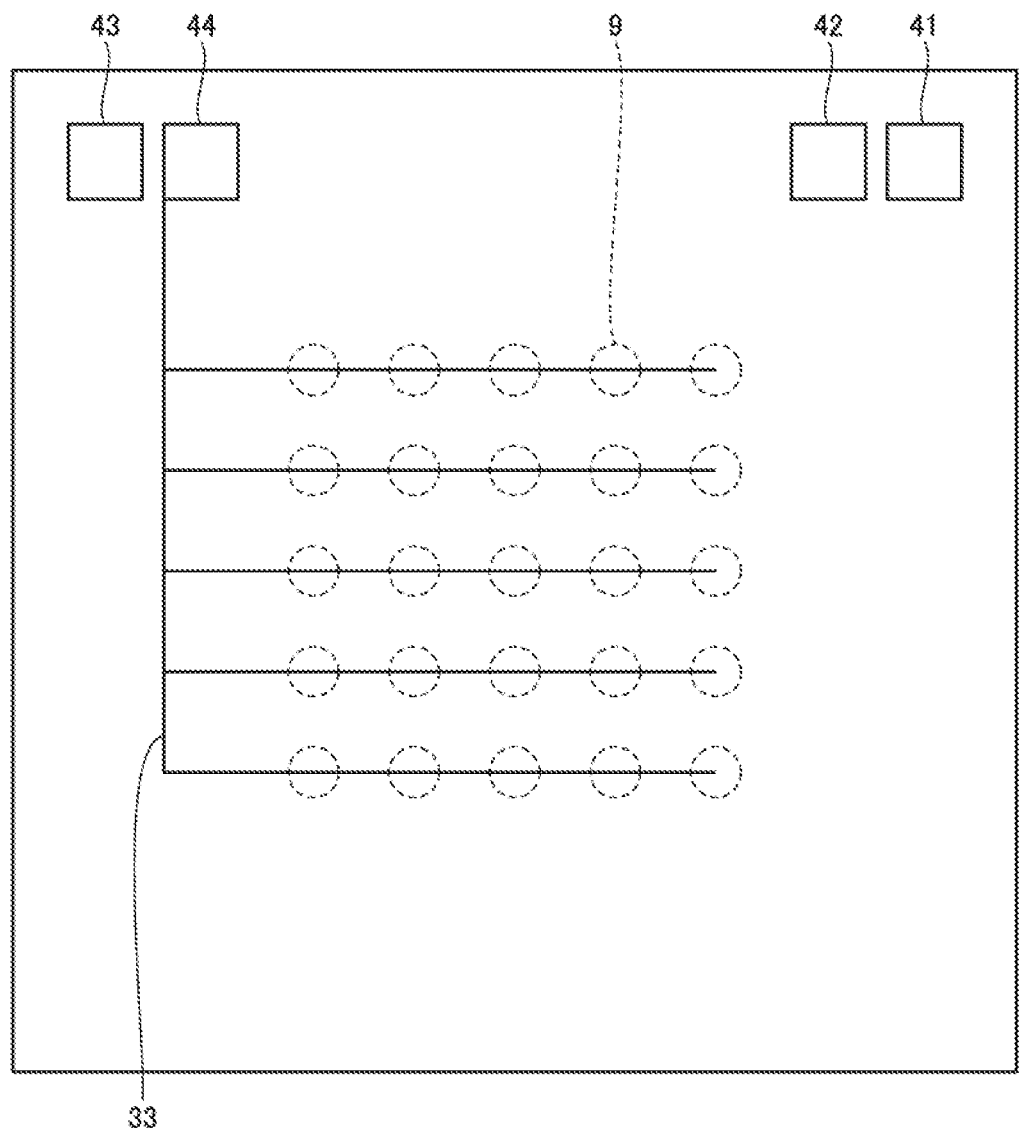
FIG. 47 is a plan view of the second stage of the method of manufacturing a piezoelectric device array in the eighth embodiment according to the present invention.

Then, the second stage of the manufacturing method will be hereinafter described. FIG. 46 shows a cross-sectional view and FIG. 47 shows a plan view. By the same method as that described with reference to FIGS. 11 to 17, upper layer 2 including protection film 6, first piezoelectric layer 4, intermediate protection film 10, second piezoelectric layer 5, and upper electrode 33 is formed. Then, through holes 7b, 7a, and 8 are formed. Intermediate electrodes 32b, 32a and lower electrode 31 are exposed at the bottoms of through holes 7b, 7a, and 8, respectively. In addition, lower electrode 31, intermediate electrode 32 and upper electrode 33 may be formed so as to extend over a plurality of piezoelectric elements. Alternatively, for the purpose of applying or detecting a voltage so as to allow a plurality of piezoelectric elements to be independently driven or sensed, lower electrode 31, intermediate electrode 32 and upper electrode 33 may be formed so as to be electrically insulated from other piezoelectric elements for each piezoelectric element or for each group of piezoelectric elements.

Figure 48:
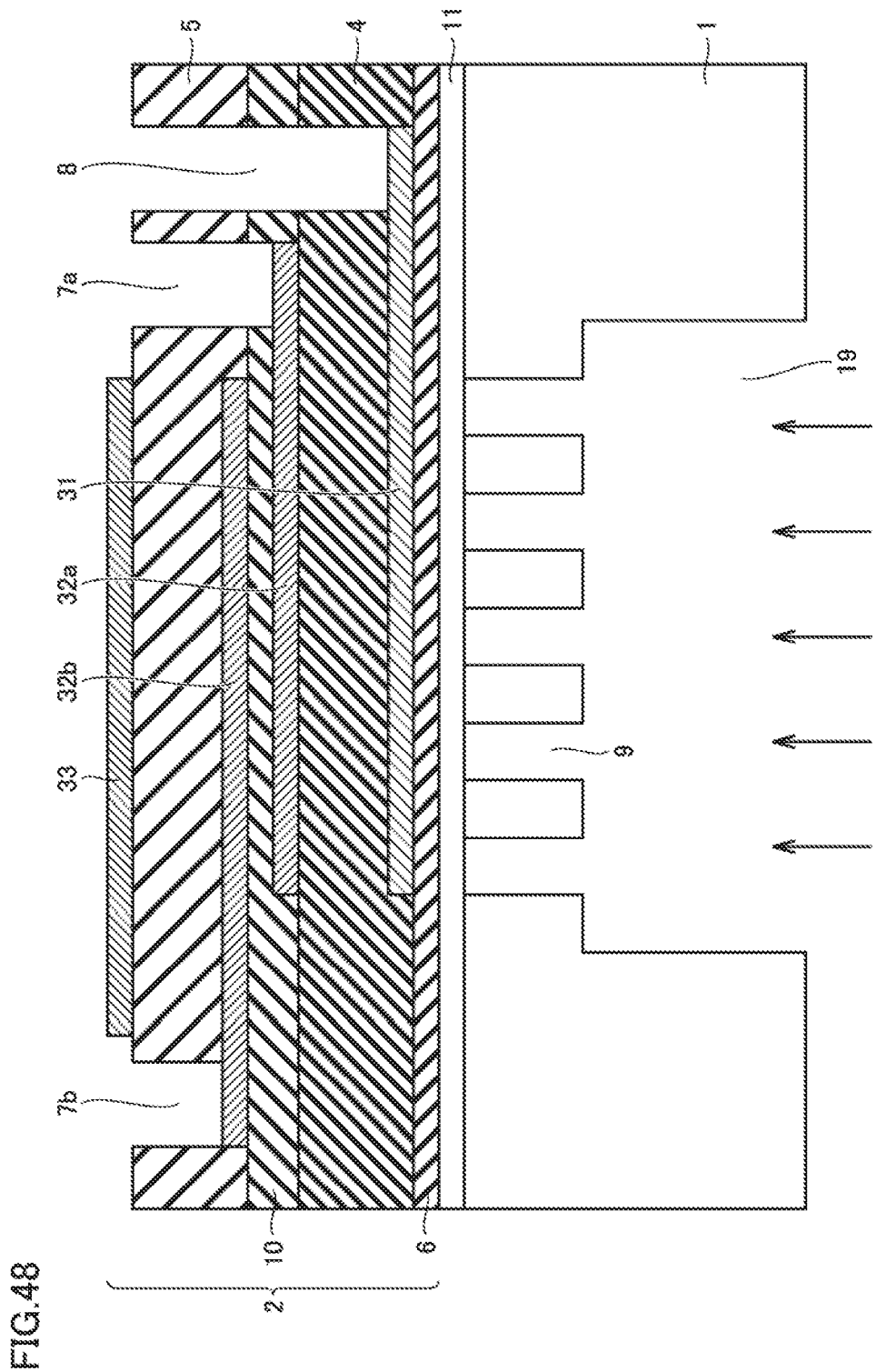
FIG. 48 is a cross-sectional view of the third stage of the method of manufacturing a piezoelectric device array in the eighth embodiment according to the present invention.
Figure 49:
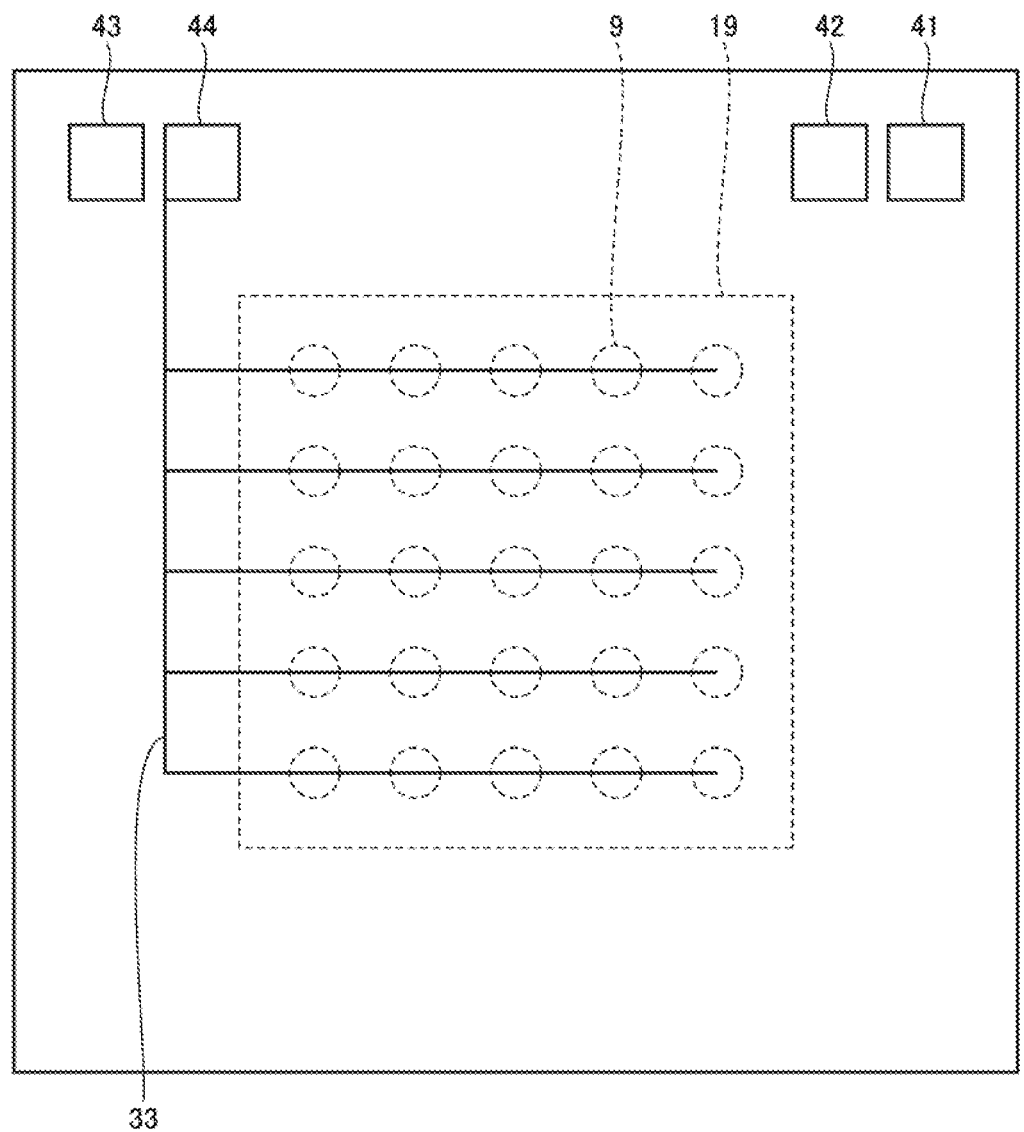
FIG. 49 is a plan view of the third stage of the method of manufacturing a piezoelectric device array in the eighth embodiment according to the present invention.

Then, the third stage of the manufacturing method will be hereinafter described. FIG. 48 shows a cross-sectional view and FIG. 49 shows a plan view. A large opening 19 is formed by performing Deep Reactive Ion Etching (DRIE) from the back surface of base member 1. Thereby, opening 9 originally formed within base member 1 is opened downward. This results in the state where a plurality of openings 9 are arranged in large opening 19.

Figure 50:
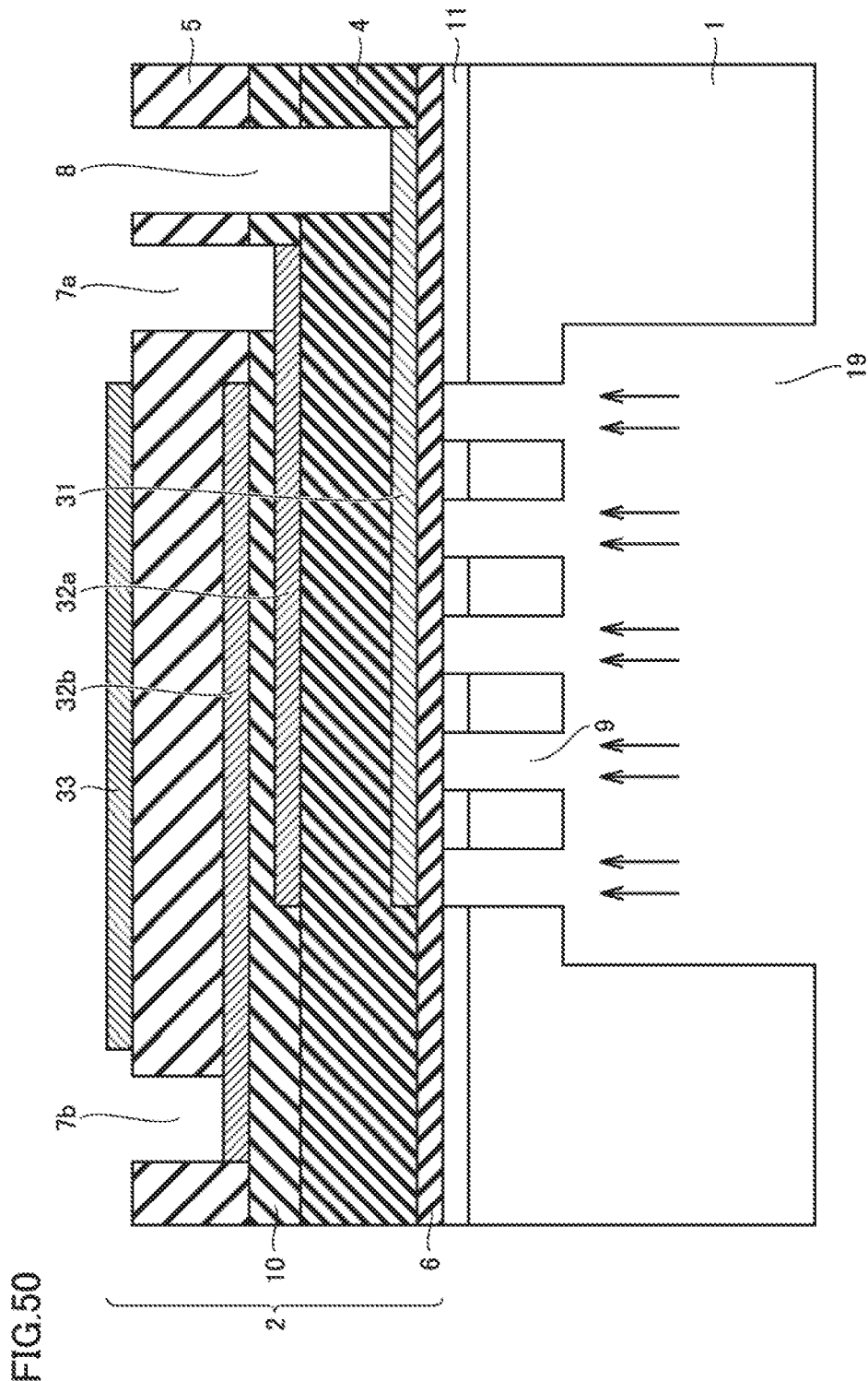
FIG. 50 is a cross-sectional view of the fourth stage of the method of manufacturing a piezoelectric device array in the eighth embodiment according to the present invention.

Then, the fourth stage of the manufacturing method will be hereinafter described. FIG. 50 shows a cross-sectional view. DRIE is performed from the back surface so as to remove cover substrate 11 exposed through opening 9. In this way, not a cover substrate 11 but a protection film 6 is to be exposed at the upper end of opening 9. Thus, the structure shown in FIG. 42, that is, a piezoelectric device array 201, is obtained. In the region corresponding to each opening 9, upper layer 2 functions as a vibration portion.

By employing the above-described manufacturing method, an element with excellent alignment accuracy as designed can be formed.

The piezoelectric device is thus formed in an array, thereby improving the characteristics. For example, in the case of a piezoelectric transducer, the sound pressure can be enhanced. Also, if the piezoelectric elements can be independently controlled, beam forming and focusing can be performed. If the piezoelectric device array as described in the present embodiment is used as a piezoelectric transformer, converted electric power can be improved.

By manufacturing a piezoelectric device array using the manufacturing method as described in the present embodiment, size reduction and array formation can be implemented while increasing a frequency, so that the excellent characteristics of the device can be maintained.

(Ultrasound Transducer)

The following is an explanation about an ultrasound transducer (Piezoelectric Micromachined Ultrasound Transducer: pMUT) to which a piezoelectric body and the MEMS technique are applied. The pMUT has device characteristics, one of which is transmission and reception sensitivity that is often required to be increased. In order to increase the transmission and reception sensitivity, it is necessary to increase a product of the sensitivity in the transmitting function and the sensitivity in the receiving function. This specifically requires the following requests to be satisfied.

(Request 1) During transmission, the vibration portion is more greatly vibrated relative to the voltage to be applied to a piezoelectric body, thereby increasing the sound pressure of the ultrasound to be generated. For this purpose, it is only necessary to use a material with a high piezoelectric d constant.

(Request 2) During reception, the vibration portion is more greatly vibrated relative to the sound pressure of the ultrasound to be received, thereby increasing the electric charge to be generated. For this purpose, it is only necessary to form the vibration portion to be thin so as to more greatly vibrate per unit stress.

(Request 3) During reception, the electric charge generated in the piezoelectric body is detected with an excellent S/N. For this purpose, it is only necessary to use a material that is higher in value piezoelectric g constant) obtained by dividing a piezoelectric d constant by a permittivity.

The material with a high piezoelectric d constant generally tends to also have a high relative permittivity in the thickness direction. Accordingly, there is no piezoelectric material that can simultaneously satisfy Requests 1 and 2 only by one type of material. From such a point of view, it is conceivable: that a material with a high piezoelectric d constant, that is, a material with a high relative permittivity in the thickness direction is used as a piezoelectric material of the pMUT for transmission; and that a material with a low relative permittivity in the thickness direction is used as a piezoelectric material of the pMUT for reception.

Accordingly, Requests 1 and 2 can be simultaneously satisfied by forming a vibration portion by stacking two types of different piezoelectric materials on conditions that one of these two types of piezoelectric materials has a high relative permittivity in the thickness direction, and that the other of these piezoelectric materials has a low relative permittivity in the thickness direction.

Particularly when the above-described structure is manufactured by the commonly-used MEMS technique, and if the piezoelectric body to be obtained belongs to the group consisting of an AlN-based material, a ZnO-based material and a GaN-based material, the relative permittivity in the thickness direction is approximately 5 to 20. If the piezoelectric body to be obtained belongs to the group consisting of a PZT-based material, a KNN-based material, a BT-based material, and a Bi alkali titanium-based material, the relative permittivity in the thickness direction is approximately 500 to 2000. In this case, $d_{31}$ of the piezoelectric d constant is about −1 pm/V to −15 pm/V in the former group, and about −50 pm/V to −200 pm/V in the latter group. Also, $d_{33}$ shows a value that is about twice as high as $d_{31}$. Therefore, it is desirable to use the material belonging to the former group as a piezoelectric material of the pMUT for reception, and to use the material belonging to the latter group as a piezoelectric material of the pMUT for transmission. By combining these conditions, the above-described structure can be realized.

In order to excellently satisfy both Requests 1 and 2, for example, when comparing the relative permittivity of the first piezoelectric layer in the thickness direction and the relative permittivity of the second piezoelectric layer in the thickness direction, it is preferable that one of these relative permittivities is more than 50 times as high as the other of these relative permittivities. Such conditions can be satisfied by forming a stacked structure using a piezoelectric material belonging to the former group and a piezoelectric material belonging to the latter group.

In view of the above, in the piezoelectric device, it is preferable that: (i) a piezoelectric layer among the first piezoelectric layer and the second piezoelectric layer that is lower in relative permittivity in the thickness direction is mainly made of a piezoelectric material selected from the group consisting of an AlN-based material, a ZnO-based material and a GaN-based material; and (ii) a piezoelectric layer among the first piezoelectric layer and the second piezoelectric layer that is higher in relative permittivity in the thickness direction is mainly made of a piezoelectric material selected from the group consisting of a PZT-based material, a KNN-based material, a BT-based material, and a Bi alkali titanium-based material.

Ninth Embodiment

The piezoelectric transformer in the ninth embodiment according to the present invention includes a piezoelectric device or a piezoelectric device array that have been described in one of the above embodiments.

The following is an explanation about the case where the piezoelectric device or the piezoelectric device array according to the present invention is used as a piezoelectric transformer. There is an energy harvesting field as an example to which the above-described technique is applied. There is a system devised for a wireless sensor network, the system being configured to generate electric power required to drive a wireless sensor element from nature and to supply the generated electric power. Examples of an element serving to generate electric power in such a system includes a thermoelectric element configured to convert thermal energy into electric power, and an optical power generation element configured to convert optical energy into electric power. However, the voltage generated from each of these elements is about several 10 mV to about several 100 mV, which cannot drive an 1C as it is. In such the system, a boosting transformer formed of a winding is generally used. If a piezoelectric transformer can be used at such a portion, voltage conversion can be performed using an element that is improved in efficiency and reduced in size as compared with the boosting transformer formed of a winding.

The following is an explanation as to how to use a piezoelectric transformer including a piezoelectric device or a piezoelectric device array according to the present invention. First, a direct-current (DC) voltage (for example, about 100 mV) generated in nature is chopped with a resonance frequency and input into the PZT layer. In this case, since the PZT layer has a large electromechanical coupling coefficient and also has a high permittivity, this PZT layer can store large energy. When a vibration portion is resonance-driven in a bending mode, the AlN layer located to awe this PZT layer is largely distorted, with the result that energy is mechanoelectricaliy converted and extracted from the AlN layer as electrical energy. If the efficiency is defined as 100%, all of the electrical energy stored in the PZT layer and the vibrational energy in the vibration portion are converted in the AlN layer as electrical energy and extracted. In this case, since the AlN layer is lower in permittivity than the PZT layer, the energy can be extracted as a higher voltage on the AlN side.

In this case, if the "PZT layer" is formed of a material belonging to the group consisting of a PZT-based material, a KNN-based material, a BT-based material, and a Bi alkali titanium-based material, and the "AlN layer" is formed of a material belonging to the group consisting of an AlN-based material, a ZnO-based material and a GaN-based material, the permittivity difference between these two layers can be increased.

Figure 51:
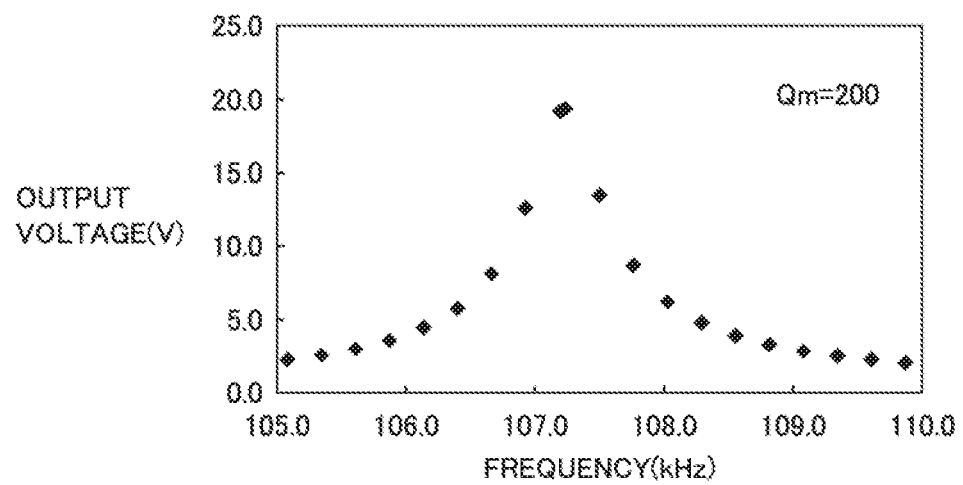
FIG. 51 is a graph showing an output voltage at a mechanical quality factor Qm of 200.
Figure 52:
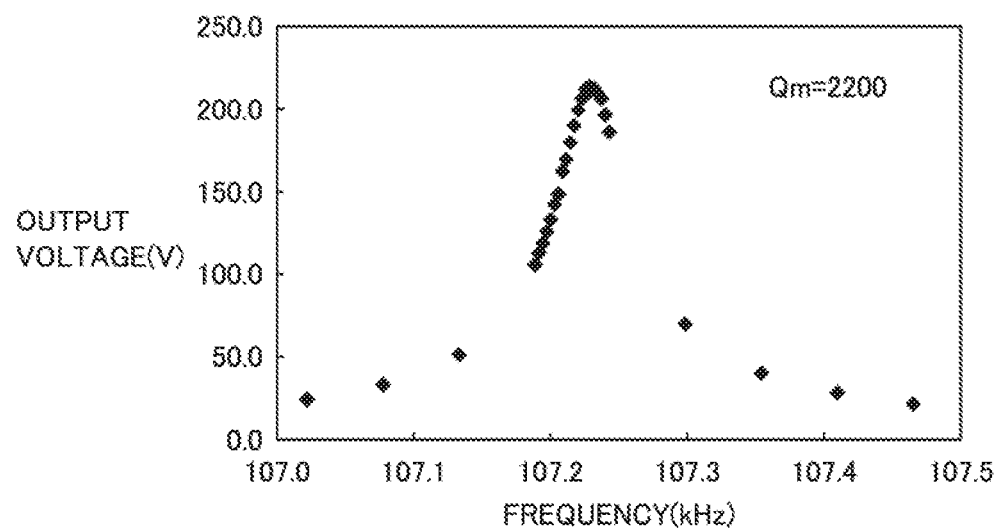
FIG. 52 is a graph showing the output voltage at a mechanical quality factor Qm of 2200.

FIGS. 51 and 52 each show the first calculation example by the finite element method. In the first calculation example, the outer diameter of the vibration portion was 500 μm, the PZT layer was located on the upper side, the AlN layer was located on the lower side, and the thickness of each of the PZT layer and the AlN layer was 1 μm. In addition, each of the PZT layer and the AlN layer was polarized in the thickness direction. Furthermore, the lower electrode was made of Mo, the intermediate electrode was made of Pt, the upper electrode was made of Au, and the thickness of each of these electrodes was 100 nm. The intermediate electrode was configured to extend over the entire surface. Each of the lower electrode and the upper electrode was formed in a circular shape having a diameter of 300 μm. No load is connected between the lower electrode and the intermediate electrode, which are open therebetween. Then, 1V was input into the upper electrode of the piezoelectric element described above, the electric potential of the electrode provided on the AlN layer side, that is, the lower electrode, was calculated assuming that the intermediate electrode was defined as a ground electrode. The calculation was performed about two cases where the Qm (mechanical quality factor) of each of all materials (an AlN film, a PZT film, an electrode) in the vibration portion was set at 200 and set at 2200. In the first calculation example, the values shown in Table 4 were used as the material constants of PZT and MN except for Qm.

FIG. 51 shows a calculation result obtained in the case where Qm=200. FIG. 52 shows a calculation result obtained in the case where Qm=2200. These graphs show that a voltage of about 20V can be extracted from the AlN layer side in the case where Qm=200 and a voltage of about 200V can be extracted from the AlN layer side in the case where Qm=2200. It also shows that boost ratios of 20 and 200 can be achieved, thereby implementing a function as a piezoelectric transformer.

The second calculation example by the finite element method will be hereinafter described. In the second calculation example, it was assumed that the structure similar to that of piezoelectric device 101 shown in FIGS. 1 and 2 was employed, in which the vibration portion was formed to have a circular shape having an outer diameter of 270 µm, the PZT layer was located on the upper side, and the AlN layer was located on the lower side. On the above-described conditions, the performance as a piezoelectric transformer was calculated by the finite element method while changing the thicknesses of the PZT layer and the AlN layer. It is to be noted that each of the PZT layer and the AlN layer was polarized in the film thickness direction. In this case, the lower electrode was made of Mo, the intermediate electrode was made of Pt, and the upper electrode was made of Au, in which the thickness of each a these electrodes was set at 100 nm. Each of the intermediate electrode, the lower electrode and the upper electrode was formed in a circular shape having a diameter of 160 µm.

When each of the electrodes is too thick, the vibration of the vibration portion is reduced and the residual stress is increased, which may exert an adverse influence upon other films. Accordingly, it is preferable that the thickness of each electrode is 300 nm or less. The influences caused by vibration inhibition and heat generation due to air resistance were ignored.

In the second calculation example, the values shown in Table 4 were used as the material constants of PZT and AlN.

TABLE 4

| Type of Material Constant | PZT | AlN |
|---|---|---|
| $\varepsilon_{11}^{T}/\varepsilon_0$ | 1490 | 8.2 |
| $\varepsilon_{33}^{T}/\varepsilon_0$ | 1510 | 10.6 |
| tan δ (%) | 0.4 | 0.1 |
| $d_{31}$ ($10^{-12}$ m/V) | −131 | −2.6 |
| $d_{33}$ ($10^{-12}$ m/V) | 271 | 5.5 |
| $d_{15}$ ($10^{-12}$ m/V) | 400 | −4.1 |
| $Q_m$ | 970 | 1000 |
| $S_{11}^{E}$ ($10^{-12}$ m$^2$/N) | 12.4 | 3.5 |
| $S_{12}^{E}$ ($10^{-12}$ m$^2$/N) | −4.1 | −1.0 |
| $S_{13}^{E}$ ($10^{-12}$ m$^2$/N) | −5.2 | −0.8 |
| $S_{33}^{E}$ ($10^{-12}$ m$^2$/N) | 14.3 | 3.0 |
| $S_{44}^{E}$ ($10^{-12}$ m$^2$/N) | 34.0 | 8.5 |
| $S_{66}^{E}$ ($10^{-12}$ m$^2$/N) | 33.0 | 9.1 |
| ρ ($10^3$ kg/m$^3$) | 7.8 | 3.3 |

In the second calculation example, a total of 13 patterns of levels A−6 to A−1, A−0, and A+1 to A+6 were calculated. The results are shown in Table 5.

TABLE 5

| Level | PZT Thickness (µm) | AlN Thickness (µm) | PZT Thickness/ AlN Thickness | Resonance Frequency (kHz) | Boost Ratio | Power Transfer Efficiency (%) |
|---|---|---|---|---|---|---|
| A − 6 | 0.31 | 1.70 | 0.18 | 419 | 23.0 | 4 |
| A − 5 | 0.57 | 1.57 | 0.36 | 393 | 39.7 | 15 |
| A − 4 | 0.78 | 1.43 | 0.55 | 378 | 45.0 | 27 |
| A − 3 | 0.95 | 1.31 | 0.73 | 369 | 44.8 | 35 |
| A − 2 | 1.09 | 1.20 | 0.91 | 363 | 42.9 | 42 |
| A − 1 | 1.15 | 1.15 | 1.00 | 360 | 41.4 | 45 |
| A − 0 | 1.20 | 1.10 | 1.09 | 358 | 39.4 | 47 |
| A + 1 | 1.25 | 1.06 | 1.18 | 356 | 38.2 | 49 |
| A + 2 | 1.29 | 1.02 | 1.27 | 355 | 36.4 | 50 |
| A + 3 | 1.37 | 0.94 | 1.45 | 353 | 33.7 | 53 |
| A + 4 | 1.44 | 0.88 | 1.64 | 350 | 30.9 | 55 |
| A + 5 | 1.49 | 0.82 | 1.82 | 349 | 28.7 | 57 |
| A + 6 | 1.54 | 0.77 | 2.00 | 347 | 26.7 | 58 |

At levels A−6 to A+6, the film thickness ratio is set such that the thickness ratio between the PZT layer and the AlN layer falls between 0.1.8 and 2.00. At each of the levels, the entire film thickness is determined so as to cause displacement by the same amount when the same pressure is applied to the vibration portion.

On the above-described precondition, the voltage output to the lower electrode when applying a voltage of IV as an input voltage to the upper electrode was derived, and the output power and the input power in that case were derived. Furthermore, the output voltage/input voltage was derived as a "boost ratio". The output powerlinput power was derived as "power transfer efficiency". At each of the levels, a load is connected between the lower electrode and the intermediate electrode so as to achieve impedance matching.

Although the total thickness of the PZT layer and the AlN layer is about 2 µm, it has been already confirmed that the similar tendency is achieved even it the thickness is increased by two times or three times with the same ratio. Although the input voltage is set at IV in this case, the similar tendency is also achieved even if the input voltage is set at a lower voltage, for example, at 1 mV.

Figure 55:
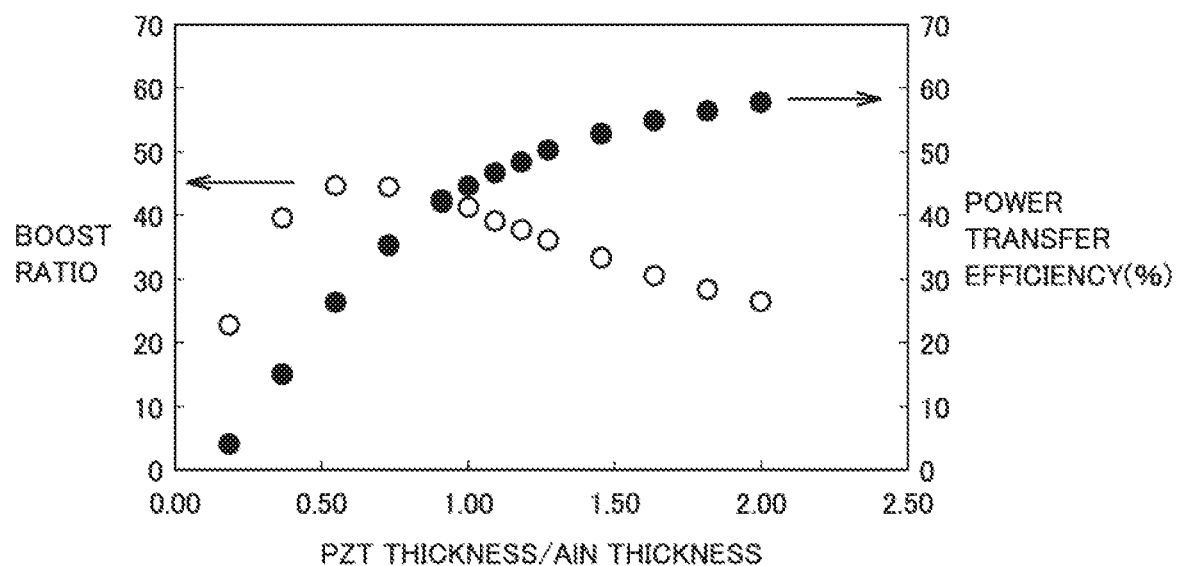
FIG. 55 is a graph showing the influence upon the boost ratio and the power transfer efficiency achieved when the PZT thickness/AlN thickness is changed.

FIG. 55 shows a graph plotted from the relation among: the PZT thickness/AlN thickness represented along the horizontal axis; the boost ratio represented along the vertical axis on the left side; and the power transfer efficiency represented along the vertical axis on the right side, based on the calculation results shown in Table 5.

As apparent from FIG. 55, the boost ratio changes according to the PZT thickness/AlN thickness. Particularly, FIG. 55 shows that the boost ratio is improved in the region in which PZT thickness/AlN thickness <1.0, as compared with the case where the PZT thickness and the AlN thickness are set to be equal that is, the case where PZT thickness/AlN thickness=1.0. Therefore, it is preferable that PZT thickness/ AlN thickness <1.0. In this configuration, one of first piezoelectric layer 4 and second piezoelectric layer 5 that is higher in relative permittivity in the thickness direction is thinner than the other of first piezoelectric layer 4 and second piezoelectric layer 5 that is lower in relative permittivity in the thickness direction.

In the case where PZT thickness/AlN thickness <0.55, the boost ratio is on the contrary decreased as compared with the case where PZT thickness/AlN thickness=1.0. This is mainly because stress neutral plane 20 exists inside the AlN layer and the in-plane stress in the different direction is distributed, as shown in FIG. 4. Generally, electric charge having a magnitude and a symbol in accordance with the in-plane stress is generated in the AlN layer, with the result that a voltage can be output. However, when the in-plane stresses act in the directions counteracting each other as described above, the generated electric charges are also to counteract each other. Therefore, it is preferable that PZT thickness/AlN thickness 0.55. Assuming that one of the piezoelectric layers that is higher in relative permittivity in the thickness direction has a thickness defined as "a" and the other of the piezoelectric layers that is lower in relative permittivity in the thickness direction has a thickness defined as "b", it is preferable that a/b is 0.55 or more.

Furthermore, as apparent from FIG. 55, the power transfer efficiency changes according to the PZT thickness/AlN thickness. Particularly, FIG. 55 also shows that the power transfer efficiency is improved in the region where PZT thickness/AlN thickness >1.0, as compared with the ease where the PZT thickness and the AlN thickness are set to be equal, that is, the case where PZT thickness/AlN thickness=1.0. Therefore, it is preferable that PZT thickness/AlN thickness>1.0. The value of the PZT thickness/AlN thickness is increased, which means that the PZT thickness is increased while the AlN thickness is decreased. In this configuration, one of first piezoelectric layer 4 and second piezoelectric layer 5 that is lower in relative permittivity in the thickness direction is thinner than the other of first piezoelectric layer 4 and second piezoelectric layer 5 that is higher in relative permittivity in the thickness direction.

When a piezoelectric body is used as a thin film, the film thickness of 0.5 µm to 4.0 µm is generally appropriate. In the range other than this film thickness, the piezoelectric property tends to deteriorate, and the film quality tends to deteriorate. Therefore, the upper limit value of the PZT thickness/AlN thickness is 4.0 µm/0.5 µm=8. By a combination as providing this upper limit value or more, sufficient performance cannot be achieved. Therefore, it is preferable that PZT thickness/AlN thickness≤8.0.

(Two-Layered Intermediate Electrode Structure)

More excellent power transfer efficiency is achieved by utilizing a structure obtained by providing the first intermediate electrode inside the AlN layer, and providing the second intermediate electrode at the boundary between the PZT layer and the AlN layer (which will be hereinafter also referred to as a "two-layered intermediate electrode structure"). Although the two-layered intermediate electrode structure has been described also in the third embodiment, the results obtained by specific calculations will be hereinafter described.

In the two-layered intermediate electrode structure, a voltage is to be applied to the input side, that is, to the PZT layer through between the upper electrode and the second intermediate electrode while a voltage is to be extracted from the output side, that is, from the AlN layer through between the lower electrode and the first intermediate electrode. Although an AlN layer exists also between the first intermediate electrode and the second intermediate electrode, this layer does not function as a piezoelectric body. The effect achieved by this configuration was verified as described below.

The PZT layer and the AlN layer were formed to have the same thicknesses as those at each of levels A-5, A-3 and A-0 in Table 5. The first intermediate electrode was provided inside the AlN layer. The second intermediate electrode was provided at the boundary between the PZT layer and the AlN layer. In addition, each of the PZT layer and the AlN layer was polarized in the thickness direction. The lower electrode was made of Mo, the first intermediate electrode was made of Mo, the second intermediate electrode was made of Pt, and the upper electrode was made of Au, in which the thickness of each of these electrodes was set at 100 nm. Each of the first intermediate electrode, the second intermediate electrode, the lower electrode, and the upper electrode was formed to have a circular outer shape having a diameter of 160 µm.

In this case, calculations were performed in the same manner as the calculation performed in the case where the number of intermediate electrodes was only one while changing the position of the first intermediate electrode in the film thickness direction in the state where the thickness of the entire AlN layer was kept fixed. The results are shown in Table 6. In the calculation example in Table 6, the values shown in Table 4 were used as the material constants of PZT and AlN.

TABLE 6

| Level | PZT Thickness (µm) | AlN Thickness (µm) | PZT Thickness/ AlN Thickness | Distance between First Intermediate Electrode and Second Intermediate Electrode (µm) | Resonance Frequency (kHz) | Boost Ratio | Power Transfer Efficiency (%) |
|---|---|---|---|---|---|---|---|
| B-1 | 0.57 | 1.57 | 0.36 | 0.28 | 392 | 49.4 | 39.7 |
| B-2 | 0.57 | 1.57 | 0.36 | 0.57 | 391 | 44.4 | 56.1 |
| B-3 | 0.57 | 1.57 | 0.36 | 0.85 | 391 | 36.8 | 63.0 |
| B-4 | 0.57 | 1.57 | 0.36 | 1.14 | 392 | 28.5 | 62.3 |
| B-5 | 0.57 | 1.57 | 0.36 | 1.28 | 392 | 23.8 | 57.4 |
| C-1 | 0.95 | 1.31 | 0.73 | 0.24 | 368 | 43.8 | 48.2 |
| C-2 | 0.95 | 1.31 | 0.73 | 0.48 | 368 | 38.2 | 57.4 |
| C-3 | 0.95 | 1.31 | 0.73 | 0.71 | 368 | 31.9 | 60.8 |
| C-4 | 0.95 | 1.31 | 0.73 | 0.95 | 368 | 24.9 | 57.7 |
| C-5 | 0.95 | 1.31 | 0.73 | 1.07 | 368 | 20.7 | 51.9 |
| D-1 | 1.20 | 1.10 | 1.09 | 0.20 | 357 | 36.8 | 52.6 |
| D-2 | 1.20 | 1.10 | 1.09 | 0.40 | 357 | 32.1 | 57.7 |
| D-3 | 1.20 | 1.10 | 1.09 | 0.60 | 357 | 27.2 | 58.5 |
| D-4 | 1.20 | 1.10 | 1.09 | 0.80 | 357 | 21.3 | 53.7 |
| D-5 | 1.20 | 1.10 | 1.09 | 0.90 | 357 | 17.2 | 47.1 |

Figure 56:
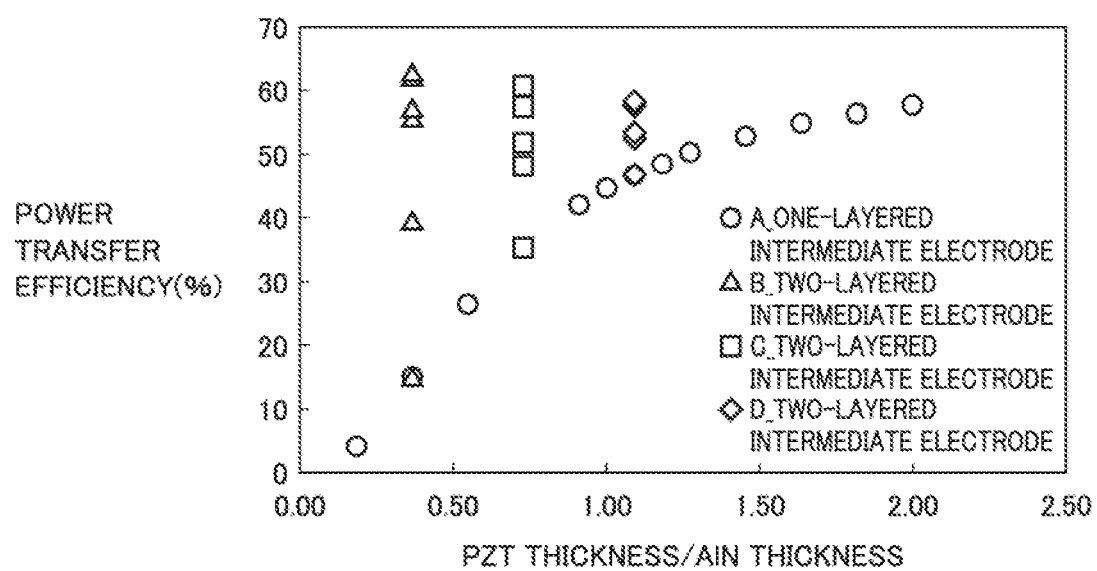
FIG. 56 is a graph showing the relation between the PZT thickness/AlN thickness and the power transfer efficiency at each level shown in Table 6.

FIG. 56 shows the power transfer efficiency obtained herein together with the results obtained when the number of intermediate electrodes is only one. FIG. 56 shows that high power transfer efficiency can be obtained by providing a two-layered intermediate electrode structure even if a stress neutral plane exists inside the AlN layer.

In view of the above, it is preferable that a two-layered intermediate electrode structure is employed in the range in which at least the relation of PZT thickness/AlN thickness≤1.09 is satisfied.

(Application Example of Piezoelectric Transformer)

As an application example of the piezoelectric transformer according to the present invention, it is also conceivable to provide an electrostatic MEMS actuator requiring a high voltage, a driving transformer made of piezoelectric ceramics for haptics, and the like, other than the energy harvesting field as described above. Furthermore, the piezoelectric transformer according to the present invention can also be applicable as a voltage source of a plasma generation device for a microplasma source and as a voltage source of a xenon flash.

The piezoelectric transformer in the present embodiment is smaller in size, can be reduced in profile, and is higher in efficiency as compared with a winding transformer. According to the present embodiment, a piezoelectric transformer with a high boost ratio and a large converted power can be implemented.

The piezoelectric transformer in the present embodiment does not cause a magnetic noise unlike a winding transformer.

(Formation in Array)

The piezoelectric transformer including a piezoelectric device array allows the capacity to be increased, so that the impedance can be reduced. In the following description, the portion including one vibration portion will be referred to as a "piezoelectric transformer element". In the following description, the piezoelectric transformer element will be abbreviated simply as an "element".

Figure 57:
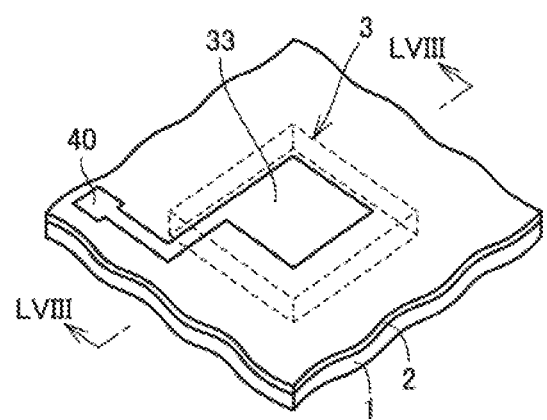
FIG. 57 is a perspective view of the piezoelectric device.
Figure 58:
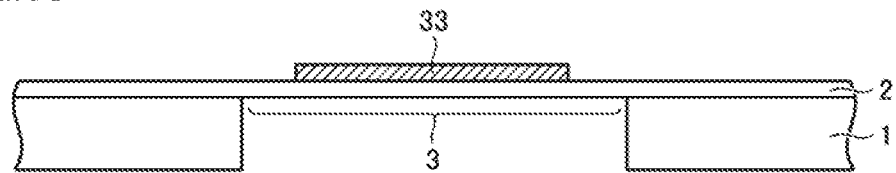
FIG. 58 is a cross-sectional view taken along an arrow line LVIII-LVIII in FIG. 57.

When the piezoelectric device array is designed, for example, the piezoelectric transformer element including a circular-shaped vibration portion as shown in FIG. 1 may be formed in an array, or the piezoelectric transformer element including a square-shaped vibration portion as shown in FIG. 57 may be formed in an array. FIG. 58 shows a cross-sectional view taken along an arrow line LVIII-LVIII in FIG. 57. FIGS. 57 and 58 each show upper electrode 33, in which an intermediate electrode, a lower electrode, a first piezoelectric layer, a second piezoelectric layer, and a protection film are not individually shown, but collectively shown as upper layer 2 in a simplified manner. FIGS. 57 and 58 also do not show through holes through which the intermediate electrode and the lower electrode are exposed.

Figure 59:
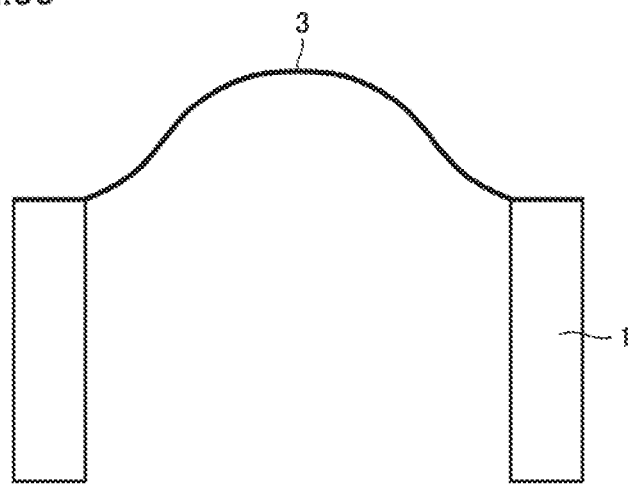
FIG. 59 is a diagram schematically showing the vibration shape of the vibration portion.

In addition, these piezoelectric transformer elements are driven using a fundamental vibration mode in which vibration has one antinode for one vibration portion. The vibration shape of the vibration portion in this case is shown in FIG. 59. FIG. 59 shows only base member 1 and vibration portion 3 for the sake of simplification of description, but does not show other structures. This also applies to the following figures regarding the vibration shape.

Even if the size per element is reduced, the impedance per element does not change. Accordingly, if the size of one element is reduced as much as possible to increase the number of arrays, the impedance per unit area can be greatly decreased.

(Countermeasures Against Problem about Vibration Leakage in Piezoelectric Device Array)

Figure 60:
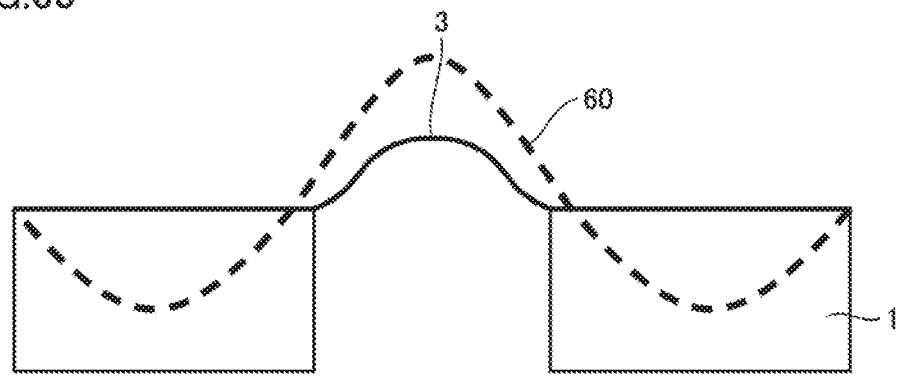
FIG. 60 is an explanatory diagram of vibration leakage.

In the vibration mode utilizing the bending vibration of the vibration portion, there occurs a problem that vibration leaks to the outside of vibration portion 3, that is, toward base member 1, during driving as shown in FIG. 60. In FIG. 60, a curved line 60 shows the theoretical manner in which vibration should appear. Since vibration portion 3 is deformable to some extent according to this vibration, vibration can exist. However, since base member 1 is hardly deformable, vibrational energy is to leak through base member 1. Such energy loss will be hereinafter referred to as "vibration leakage".

Figure 61:
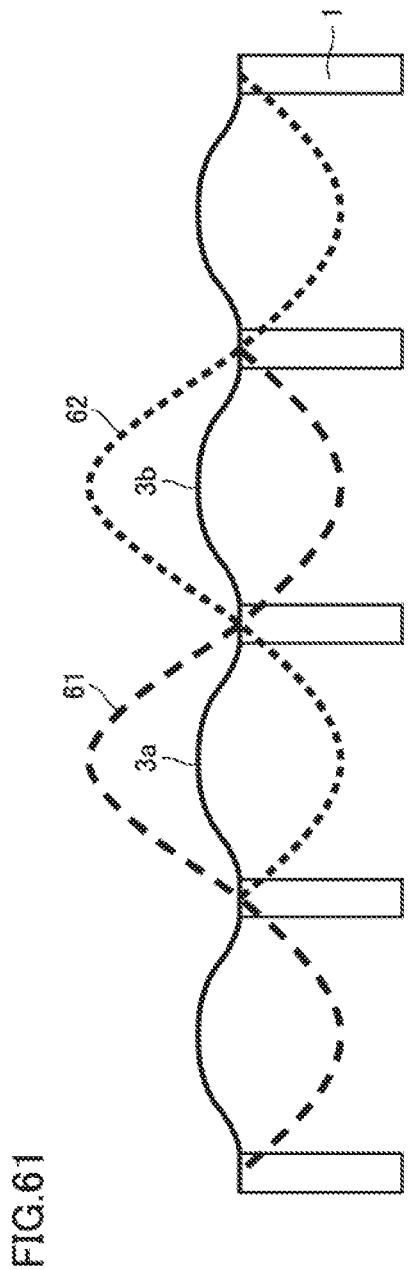
FIG. 61 is an explanatory diagram showing the manner in which vibration leakage occurring from each element inhibits vibration of each of elements adjacent thereto.

The vibrational energy leaked in this way may hinder vibration of the surrounding piezoelectric transformer elements. FIG. 61 shows the case where the piezoelectric transformer is driven in the array structure, for example, as shown in FIG. 43. In FIG. 61, attention is focused on vibration portions 3a and 3b as two vibration portions adjacent to each other. Vibration caused in vibration portion 3a tends to propagate vibration shown by a curved line 61 also to the peripheral area. Vibration caused in vibration portion 3b tends to propagate vibration shown by a curved line 62 also to the peripheral area. Since curved line 61 and curved line 62 are in opposite phase, these curved lines hinder each other. For such a reason, vibration leakage caused from each element may hinder vibration of the element adjacent thereto, so that a sufficient function as a piezoelectric device array may not be able to be performed.

In view of the background described above, when a piezoelectric device array is to be implemented, it is preferable to implement the following items (1) to (3).

Figure 62:
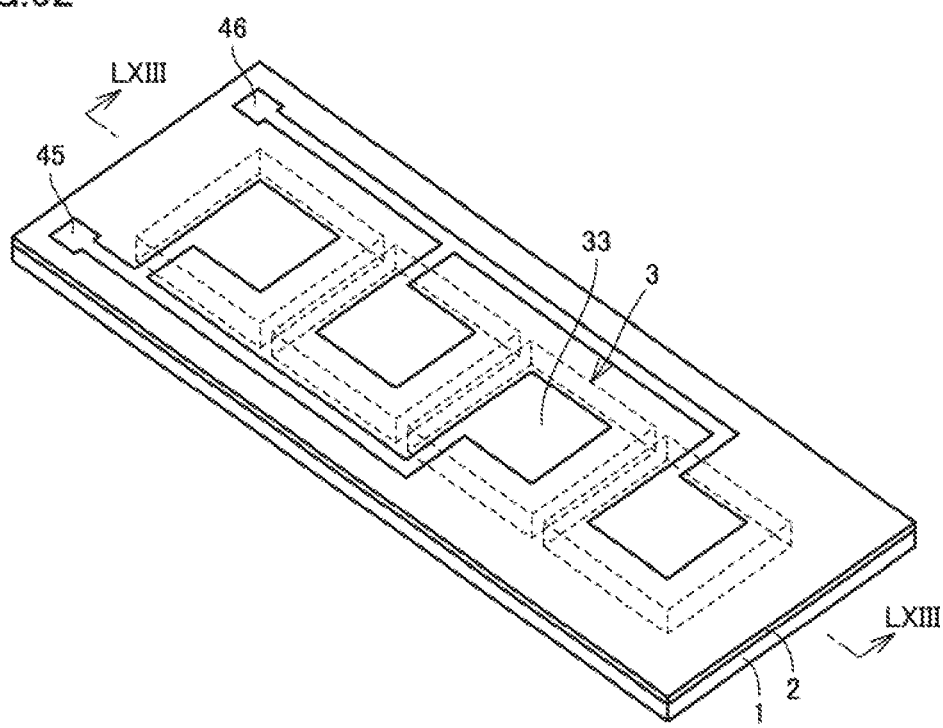
FIG. 62 is a perspective view of the piezoelectric device array.
Figure 63:
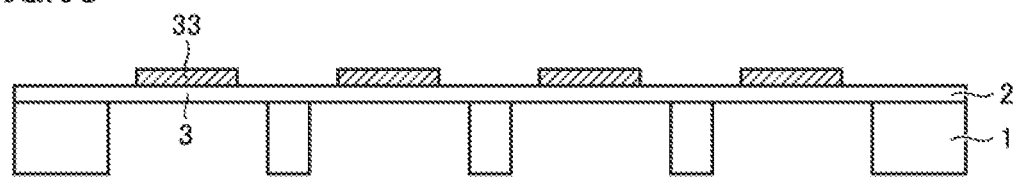
FIG. 63 is a cross-sectional view taken along an arrow line in FIG. 62.

(1) As shown in FIG. 62, the electrodes in the elements adjacent to each other are provided with an interconnection such that alternating-current (AC) voltages being in opposite phase and having the same frequency are applied to these electrodes. Two pad electrodes 45 and 46 are provided on the upper surface of upper layer 2. A vibration portion 3 having upper electrode 33 connected to pad electrode 45 and a vibration portion 3 having upper electrode 33 connected to pad electrode 46 are alternately arranged. When the piezoelectric device array is driven, different electric potentials are applied to pad electrodes 45 and 46. For example, a plus (+) electric potential is applied to pad electrode 45, and a minus (−) electric potential is applied to pad electrode 46. Alternatively, when the elements located adjacent to each other are to be applied with AC voltages in the same phase, the polarization states of the elements adjacent to each other are inverted from each other. FIG. 63 shows a cross-sectional view taken along an arrow line LXIII-LXIII in FIG. 62.

(2) The piezoelectric device array configured as described above is used to drive the elements adjacent to each other so as to be in opposite phase.

(3) it is preferable that the width of the support portion existing between the elements is narrowed as much as possible in a range that does not impair the strength of the element structure, so as to reduce the pitch between the elements.

Figure 64:
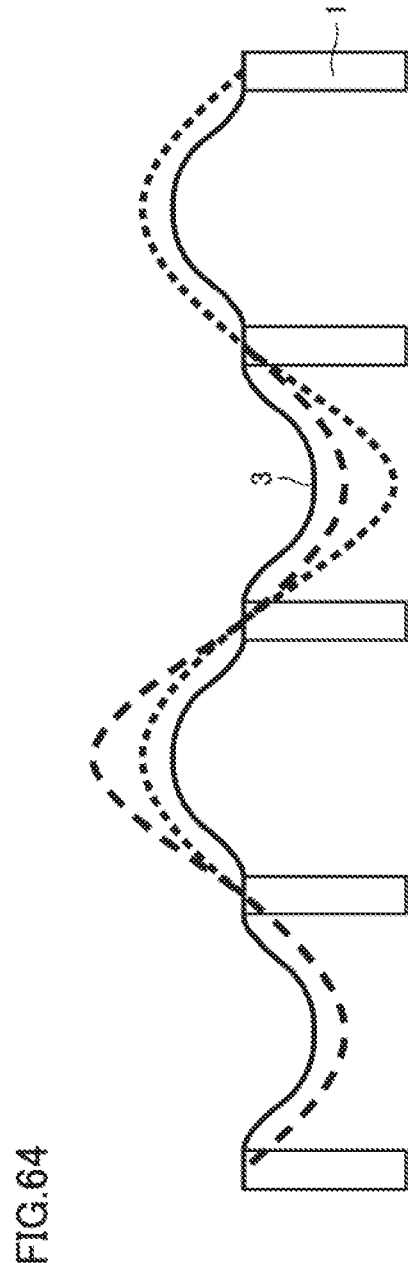
FIG. 64 is an explanatory diagram showing the manner in which vibration leakage occurring from each element intensifies vibration a each of elements adjacent thereto.

In this way, it becomes possible to prevent vibrations from weakening between the elements due to vibration leakage. On the contrary, vibrations can be strengthened between the elements as shown in FIG. 64. By employing the configuration and the driving method as described above, the elements are not independently driven, but the entire array can be driven as if this entire array is configured as one vibration body. Accordingly, the electromechanical conversion efficiency achieved as a device is improved.

The driving method as described above cannot be usually employed when an ultrasound transducer is applied. This is because, even if a plurality of elements are arranged in an array form, an ultrasound transducer is required to generate sound pressure simultaneously in the same direction as a main function. When the vibration portions driven in opposite phase are mixedly included, these vibration portions are to weaken the generated sound pressure against each other, which leads to an adverse effect. Therefore, it can be recognized that the method of driving elements adjacent to each other so as to be in opposite phase as described above is specific to the application for use as a piezoelectric transformer, (Thickness of Protection Film)

In each of piezoelectric devices 101, 101e, 102, and 103, protection film 6 is provided on the lower surface of vibration portion 3. A preferable thickness of protection film 6 will be described below. In the piezoelectric device, it is preferable that the thickness of protection film 6 is 8% or less of the thickness of vibration portion 3.

Figure 53:
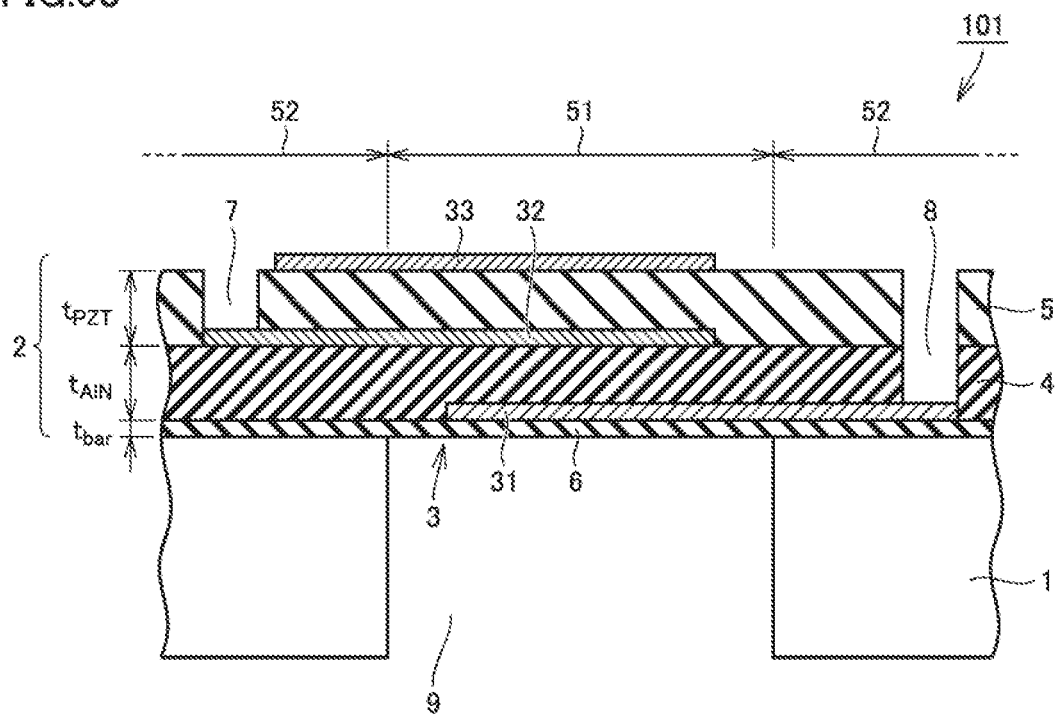
FIG. 53 is an explanatory diagram regarding the thickness of each layer in the piezoelectric device.

Piezoelectric device 101 will be hereinafter described by way of example. As already described, piezoelectric device 101 was structured by stacking upper electrode 33 made of Pt, second piezoelectric layer 5 made of PZT, intermediate electrode 32 made of Pt, first piezoelectric layer 4 made of AlN, lower electrode 31 made of Pt, and protection film 6 made of AlN sequentially in this order from the top. Each of the PZT layer and the AlN layer was to be polarized in the thickness direction. In this structure, each of upper electrode 33, intermediate electrode 32 and lower electrode 31 was formed to have a thickness of 100 nm. As shown in FIG. 53, the thickness of second piezoelectric layer 5 was defined as $t_{PZT}$, the thickness of first piezoelectric layer 4 was defined as $t_{AlN}$, and the thickness of the protection film was defined as $t_{bar}$. In this piezoelectric device 101, the diameter of vibration portion 3 was set at 500 μm, the diameter of each of upper electrode 33 and lower electrode 31 was set so as to cover 60 percent of the area of vibration portion 3.

Figure 54:
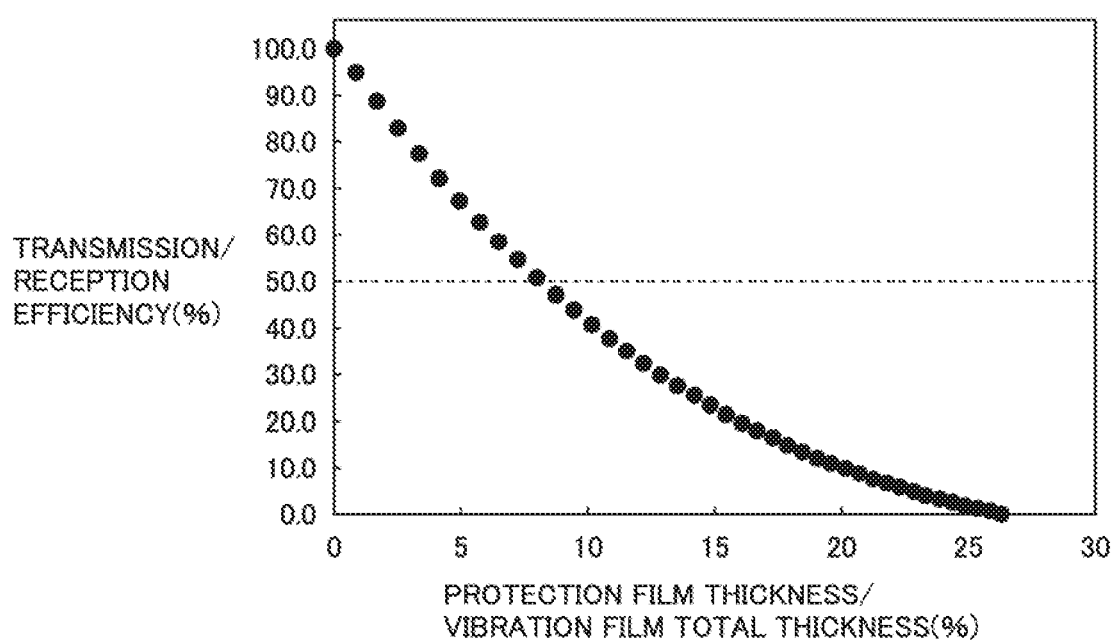
FIG. 54 is a graph showing the influence upon the transmission/reception efficiency achieved when the ratio between the thickness of a protection film and the thickness of a vibration portion is changed.

For two patterns of combinations of $(t_{PZT}, t_{AlN})$=(1.1 μm, 0.9 μm), (2.2 μm, 1.8 μm), $t_{bar}$ was changed to 0 nm, 20 nm, 40 nm, . . . , 980 nm. In each of the combinations, calculations were performed about the transmission/reception efficiency obtained in the case where driving was conducted by a PZT piezoelectric body and detection was made by an AlN piezoelectric body. The results are shown in FIG. 54. In this calculation example, the values shown in Table 4 were used as the material constants of PZT and AlN.

The "protection film thickness/vibration film total thickness" represented along the horizontal axis of the graph shows a value obtained by $t_{bar}/(100\ nm+t_{PZT}+100\ nm+t_{AlN}+100\ nm+t_{bar})\times 100$. The "vibration film total thickness" also means the thickness of vibration portion 3.

The vertical axis of the graph represents the displacement amount at $t_{bar}$=0 nm as 100 with the relative value.

As shown in FIG. 54, the transmission reception efficiency falls to reach one-half at and around a point at which the thickness of protection film 6 made of AlN exceeds 8% of the vibration film total thickness. In view of the above, it is preferable that the thickness of protection film 6 is 8% or less of the thickness of vibration portion 3.

If protection film 6 having a thickness greater than 8% of the thickness of vibration portion 3 is provided, the transmission/reception efficiency is to fall to 50% or less. Thus, in order to keep the transmission/reception efficiency at the level equal to 100%, the voltage input into the PZT layer side needs to be doubled.

Generally, based on the premise of installation on wearable devices such as a mobile phone, a power supply voltage of 3.3V may often be used. If this voltage is to be doubled, booster circuits such as a charge pump circuit and a switching regulator are required. It is not preferable to use these circuits since the power supply efficiency is decreased, a switching noise is mixed, the occupation area is increased, and the cost is increased. Furthermore, the PZT layer generally exhibits a coercive electric field of about 3 V/μm. In the case where $t_{PZT}$=1.1 μm, at an input of AC6.6 Vpp, the PZT layer is to be applied with a voltage in the vicinity of the coercive electric field or beyond the coercive electric field. This renders the operation of the PZT layer unstable, and also is not preferable from the viewpoint of reliability.

Therefore, it is preferable that the protection film thickness is set to be 8% or less of the thickness of the vibration portion so as to prevent the efficiency from falling to 50% or less.

Although the preferable thickness of the protection film in the structure of the piezoelectric device has been described, the same can be applied also to the method of manufacturing a piezoelectric device. In the method of manufacturing a piezoelectric device described in each of the above embodiments, it is preferable that the main surface of base member 1 is covered by protection film. 6, and the thickness of protection film 6 is 8% or less of the thickness of vibration portion 3.

In the method of manufacturing a piezoelectric device described in each of the above embodiments, it is preferable that first piezoelectric layer 4 is mainly made of a piezoelectric material selected from the group consisting of an AlN-based material, a ZnO-based material and a GaN-based material, and that second piezoelectric layer 5 is mainly made of a piezoelectric material selected from the group consisting of a PZT-based material, a KNN-based material, a BT-based material, and a Bi alkali titanium-based material.

Among the above-described embodiments, a plurality of embodiments may be employed in an appropriate combination.

The above-described embodiments disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST

1 base member, 2 upper layer 3, 3a, 3b vibration portion, 4 first piezoelectric layer, 5 second piezoelectric layer, 6 protection film, 7, 7a, 7b, 8 through hole (opened in a piezoelectric layer), 9 opening (opened in a base member), 10 intermediate protection film, 11 cover substrate, 13 connection portion, 14 slit, 19 large opening, 20 stress neutral plane, 31 lower electrode, 32 intermediate electrode, 32a first intermediate electrode, 32b second intermediate electrode, 33 upper electrode. 40, 41, 42, 43, 44 pad electrode, Si portion (not overlapping with a base member), 52 portion (overlapping with a base member), 60, 61, 62 curved line, 101, 101e, 102, 103 piezoelectric device, 201 piezoelectric device array.

The invention claimed is:

1. A piezoelectric device comprising:
   a base defining an opening therein; and
   an upper layer supported by the base member, the upper layer including:
   a lower electrode, an intermediate electrode and an upper electrode spaced apart from each other in a thickness direction of the piezoelectric device;
   a first piezoelectric layer disposed so as to be at least partially sandwiched between the lower electrode and the intermediate electrode; and
   a second piezoelectric layer disposed so as to overlap with the first piezoelectric layer and so as to be at least partially sandwiched between the intermediate electrode and the upper electrode,
   the lower electrode, the intermediate electrode, the upper electrode, the first piezoelectric layer and the second piezoelectric layer defining a vibration portion at a location corresponding to the opening in the base member, and
   the first piezoelectric layer and the second piezoelectric layer being different in relative permittivity in the thickness direction of the piezoelectric device, wherein a first of the first piezoelectric layer and the second piezoelectric layer that is lower in relative permittivity in the thickness direction is mainly made of a piezoelectric material selected from the group consisting of an AlN-based material, a ZnO-based material and a GaN-based material, a second of the first piezoelectric layer and the second piezoelectric layer that is higher in relative permittivity in the thickness direction is mainly made of a piezoelectric material selected from the group consisting of a PZT-based material, a KNN-based material, a BT-based material, and a Bi alkali titanium-based material, and the first of the first piezoelectric layer and the second piezoelectric layer that is lower in relative permittivity in the thickness direction is thinner than the second of the first piezoelectric layer and the second piezoelectric layer that is higher in relative permittivity in the thickness direction.

2. The piezoelectric device according to claim 1, wherein a difference between the relative permittivity of the first piezoelectric layer in the thickness direction and the relative permittivity of the second piezoelectric layer in the thickness direction is more than 50 times.

3. The piezoelectric device according to claim 1, wherein the second piezoelectric layer is higher in relative permittivity in the thickness direction than the first piezoelectric layer.

4. The piezoelectric device according to claim 1, wherein a stress neutral plane exists between the first piezoelectric layer and the second piezoelectric layer.

5. The piezoelectric device according to claim 4, wherein the stress neutral plane is located in the intermediate electrode.

6. The piezoelectric device according to claim 4, wherein a first of the first piezoelectric layer and the second piezoelectric layer that is lower in relative permittivity in the thickness direction is thinner than a second of the first piezoelectric layer and the second piezoelectric layer that is higher in relative permittivity in the thickness direction.

7. The piezoelectric device according to claim 4, further comprising an intermediate layer between the first piezoelectric layer and the second piezoelectric layer, the intermediate layer being mainly made of a material different from a material of the first piezoelectric layer and a material of the second piezoelectric layer, and wherein the stress neutral plane is located in the intermediate layer.

8. A piezoelectric device comprising:
a base defining an opening therein; and
an upper layer supported by the base member, the upper layer including:
a lower electrode, an intermediate electrode and an upper electrode spaced apart from each other in a thickness direction of the piezoelectric device;
a first piezoelectric layer disposed so as to be at least partially sandwiched between the lower electrode and the intermediate electrode; and
a second piezoelectric layer disposed so as to overlap with the first piezoelectric layer and so as to be at least partially sandwiched between the intermediate electrode and the upper electrode,
the lower electrode, the intermediate electrode, the upper electrode, the first piezoelectric layer and the second piezoelectric layer defining a vibration portion at a location corresponding to the opening in the base member, and
the first piezoelectric layer and the second piezoelectric layer being different in relative permittivity in the thickness direction of the piezoelectric device,
wherein a stress neutral plane exists between the first piezoelectric layer and the second piezoelectric layer,
wherein the intermediate electrode includes a first intermediate electrode and a second intermediate electrode, the piezoelectric device further comprising:
an intermediate protection film disposed between the first intermediate electrode and the second intermediate electrode, and wherein
the first intermediate electrode is disposed on a side of the intermediate protection film close to the lower electrode, and the second intermediate electrode is disposed on a side of the intermediate protection film close to the upper electrode, and
the stress neutral plane is located in the first intermediate electrode or the second intermediate electrode, or located between the first intermediate electrode and the second intermediate electrode.

9. A piezoelectric device comprising:
a base defining an opening therein; and
an upper layer supported by the base member, the upper layer including:
a lower electrode, an intermediate electrode and an upper electrode spaced apart from each other in a thickness direction of the piezoelectric device;
a first piezoelectric layer disposed so as to be at least partially sandwiched between the lower electrode and the intermediate electrode; and
a second piezoelectric layer disposed so as to overlap with the first piezoelectric layer and so as to be at least partially sandwiched between the intermediate electrode and the upper electrode,
the lower electrode, the intermediate electrode, the upper electrode, the first piezoelectric layer and the second piezoelectric layer defining a vibration portion at a location corresponding to the opening in the base member, and
the first piezoelectric layer and the second piezoelectric layer being different in relative permittivity in the thickness direction of the piezoelectric device,
wherein the intermediate electrode includes a first intermediate electrode disposed, and a second intermediate electrode, the piezoelectric device further comprising:
an intermediate protection film disposed between the first intermediate electrode and the second intermediate electrode, and wherein
the first intermediate electrode is disposed on a side of the intermediate protection film close to the lower electrode, and the second intermediate electrode is disposed on a side of the intermediate protection film close to the upper electrode.

10. The piezoelectric device according to claim 1, further comprising a protection film between the base and the upper layer.

11. The piezoelectric device according to claim 10, wherein the protection film has a thickness that is 8% or less of a thickness of the vibration portion.

12. A piezoelectric device array comprising an arrangement of a plurality of piezoelectric devices according to claim 1.

13. A piezoelectric transformer comprising the piezoelectric device according to claim 1.

14. A method of manufacturing a piezoelectric device, the method comprising:
preparing a base having a main surface;

forming a lower electrode so as to at least partially cover the main surface;

forming a first piezoelectric layer so as to cover the lower electrode;

forming an intermediate electrode so as to at least partially cover the first piezoelectric layer;

forming a second piezoelectric layer so as to cover the intermediate electrode;

forming an upper electrode so as to at least partially cover the second piezoelectric layer; and partially removing a portion of the base member at a location corresponding to a vibration portion formed by stacking the lower electrode, the first piezoelectric layer, the intermediate electrode, the second piezoelectric layer, and the upper electrode, the first piezoelectric layer and the second piezoelectric layer being different in relative permittivity in a thickness direction of the piezoelectric device, wherein a first of the first piezoelectric layer and the second piezoelectric layer that is lower in relative permittivity in the thickness direction is mainly made of a piezoelectric material selected from the group consisting of an AlN-based material, a ZnO-based material and a GaN-based material, a second of the first piezoelectric layer and the second piezoelectric layer that is higher in relative permittivity in the thickness direction is mainly made of a piezoelectric material selected from the group consisting of a PZT-based material, a KNN-based material, a BT-based material, and a Bi alkali titanium-based material, and the first of the first piezoelectric layer and the second piezoelectric layer that is lower in relative permittivity in the thickness direction is thinner than the second of the first piezoelectric layer and the second piezoelectric layer that is higher in relative permittivity in the thickness direction.

15. The method of manufacturing a piezoelectric device according to claim 14, further comprising forming a protection film on the main surface of the base before forming the lower electrode, the protection film having a thickness that is 8% or less of a thickness of the vibration portion.

* * * * *